United States Patent [19]

Harada et al.

[11] Patent Number: 4,888,635
[45] Date of Patent: Dec. 19, 1989

[54] ILLUMINATING APPARATUS AND RECORDING APPARATUS MAKING USE OF THE SAME

[75] Inventors: Toshiaki Harada; Tadashi Yamamoto, both of Kawasaki, Japan

[73] Assignee: Canon Kabushiki Kaisha, Tokyo, Japan

[21] Appl. No.: 154,892

[22] Filed: Feb. 11, 1988

[30] Foreign Application Priority Data

Feb. 19, 1987 [JP] Japan ................................ 62-034534
Jan. 22, 1988 [JP] Japan ................................ 63-010851

[51] Int. Cl.⁴ .............................................. H04N 1/16
[52] U.S. Cl. ....................................... 358/75; 362/84; 355/68; 355/117
[58] Field of Search ............................ 358/75; 362/84; 355/117, 113, 67, 68

[56] References Cited

U.S. PATENT DOCUMENTS

| | | | |
|---|---|---|---|
| 769,348 | 9/1904 | Junghans | 362/84 X |
| 1,840,500 | 1/1932 | Geffcken et al. | 358/75 X |
| 2,069,664 | 2/1937 | Bartlett | 362/84 X |
| 2,279,596 | 4/1942 | Schipper | 362/84 |
| 2,455,951 | 12/1948 | Roper et al. | 362/84 X |
| 2,567,049 | 9/1951 | Belluche | 362/84 X |
| 3,791,058 | 2/1974 | Mollica | 362/84 X |
| 4,097,917 | 6/1978 | McCaslin | 362/84 X |
| 4,576,462 | 3/1986 | Lehman | 358/75 X |

FOREIGN PATENT DOCUMENTS 56-129483 10/1981 Japan ................................ 358/75
59-90460 5/1984 Japan ................................ 358/75

*Primary Examiner*—James J. Groody
*Assistant Examiner*—Mark R. Powell
*Attorney, Agent, or Firm*—Fitzpatrick, Cella, Harper & Scinto

[57] ABSTRACT

An illuminating apparatus for illuminating objects with lights has a rotary member having a plurality of types of fluorescent materials, a driving device for driving the rotary member, a lighting device for causing the fluorescent materials to emit lights, and a plurality of light paths for guiding the lights from the fluorescent materials to a plurality of objects. A recording apparatus making use of the illuminating apparatus has an image reading device capable of reading an image by device of an illuminating light, an image forming device capable of forming an image on the recording member by device of an illuminating light, a first illuminating light path through which the light emitted from one of the fluorescent materials is guided to the image reading device, a second illuminating light path through which the light emitted from one of the fluorescent materials is guided to the image forming device.

23 Claims, 18 Drawing Sheets

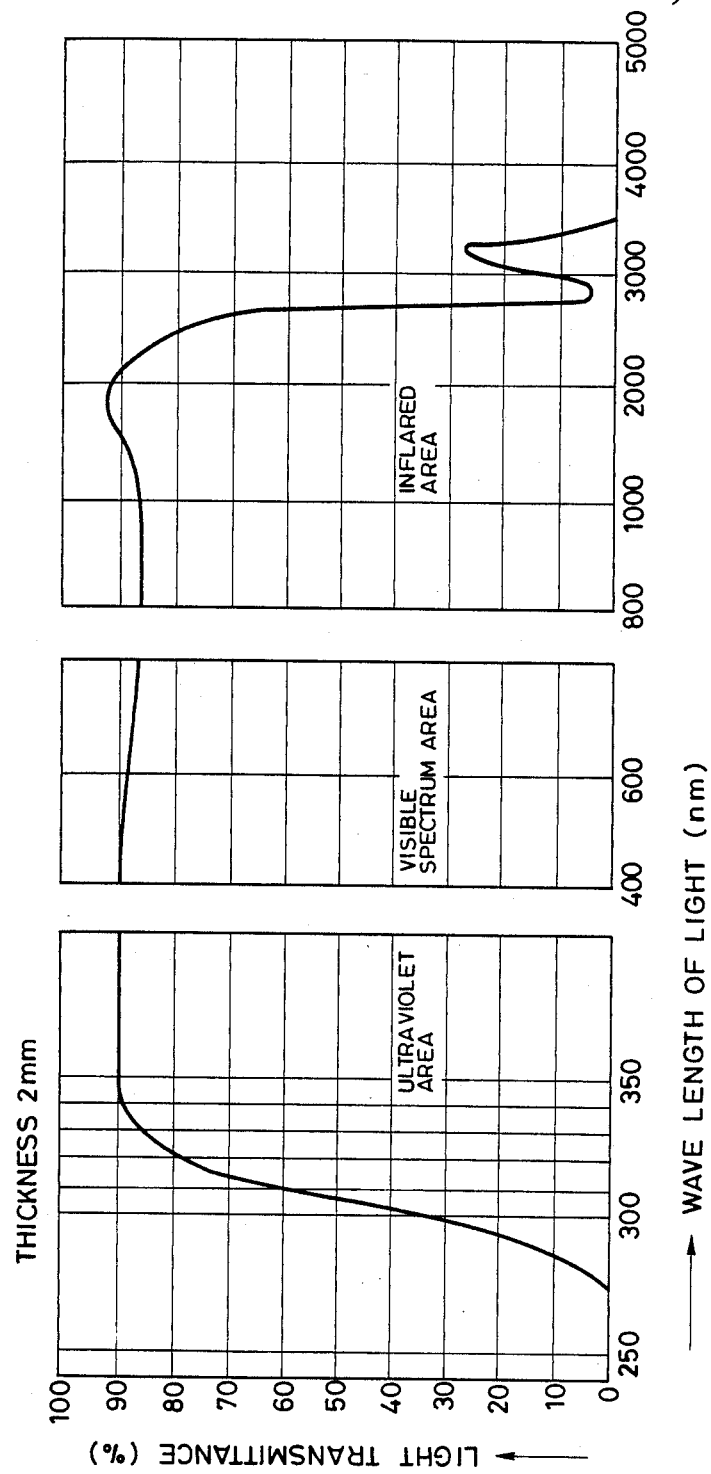

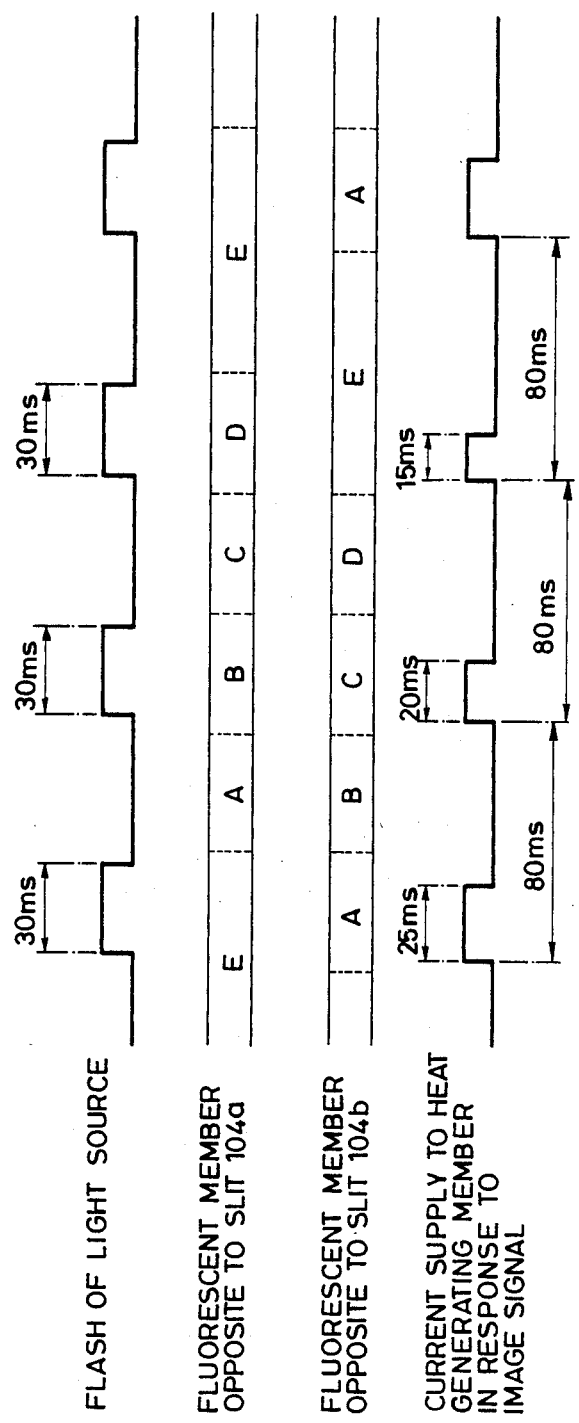

FIG. 19

| | BIT 2 | BIT 1 | BIT 0 |
|---|---|---|---|
| 3216th | 0 | 0 | 0 |
| 3215th | | 1 | |
| 2376th | 0 | | |
| 2375th | 1 | | |
| 720th | | | 0 |
| 719th | | | 1 |
| 480th | | | 1 |
| 479th | | | 0 |
| 0th | 1 | 1 | 0 |

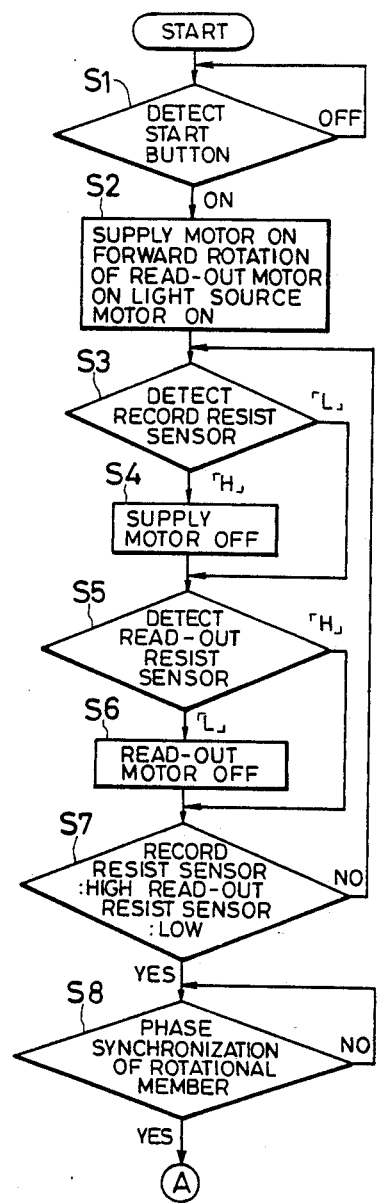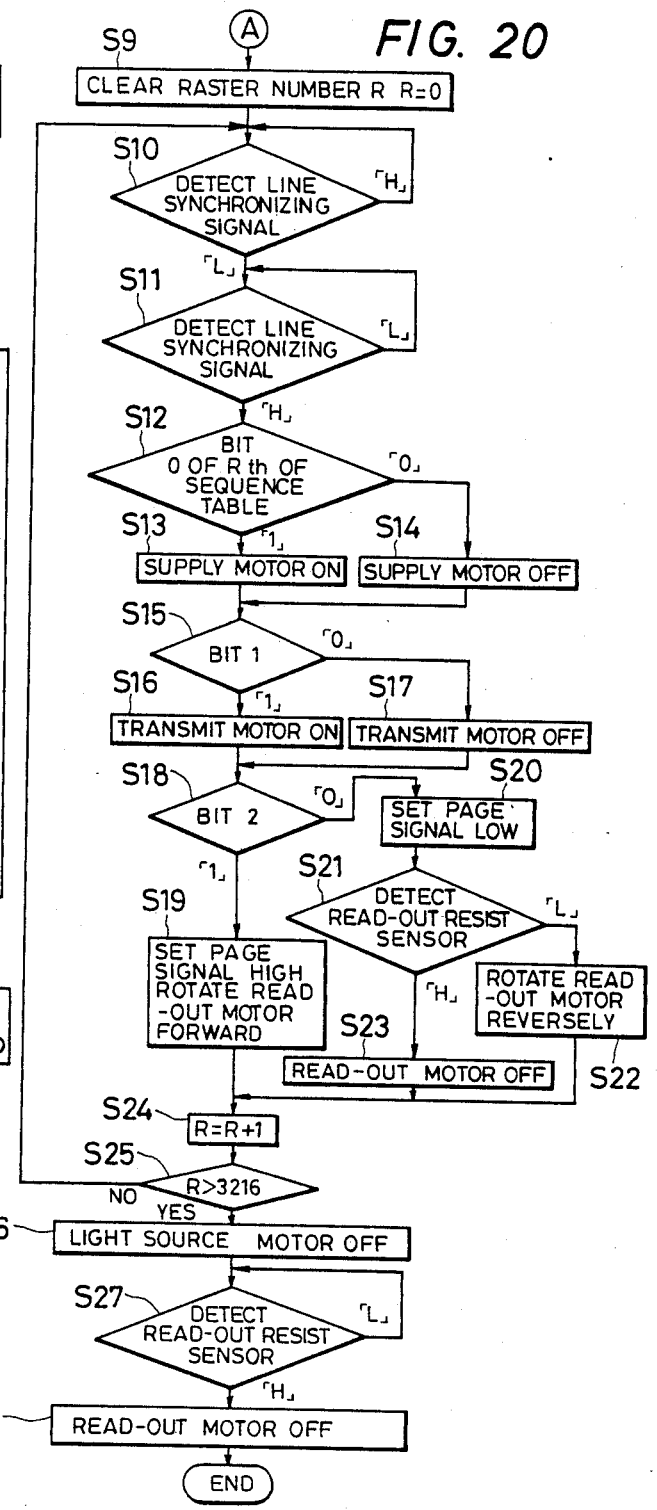
FIG. 20

ILLUMINATING APPARATUS AND RECORDING APPARATUS MAKING USE OF THE SAME

BACKGROUND OF THE INVENTION

1. Field of the Invention

The present invention relates to an illuminating apparatus for illuminating an object and also to a recording apparatus making use of the illuminating apparatus.

The term recording apparatus in this specification is used to include various types of apparatus such as printers, electronic typewriters, facsimiles, copying apparatus and so forth. The present invention can effectively be carried out in apparatus having both reading means and recording means, e.g., copying machines which reads an image on an original and records on a recording medium the image in accordance with the data obtained through the reading of the original.

2. Related Background Art

The current rapid progress in data-oriented industry has promoted development of various types of data processing systems which in turn is accompanied by development of various types of recording apparatus suited to the data processing systems.

Reading or recording of a multi-color image with any of known optical systems encounters a difficulty in illuminating a minute region with lights of different spectral characteristics while switching these lights at a high speed. Thus, the known recording apparatus are still unsatisfactory in terms of the reading/recording speed and the quality of the recorded image.

To overcome the above-described difficulty, the present applicant has already proposed an illuminating apparatus which is capable of illuminating a tiny spot while switching between different lights having different spectral characteristics, as well as a recording apparatus which makes use of the illuminating apparatus. The present applicant has already filed applications for patents in Japan on such illuminating apparatus and recording apparatus. These applications are Japanese patent application Nos. 61-93368 (application date Apr. 24, 1986), 61-212802 (application date Sept. 11, 1986), 61-212803 (Sept. 11, 1986), 61-223726 (application date Sept. 24, 1986) and 61-280738 (application date Nov. 27, 1986). On the basis of Convention Priorities on these Japanese patent applications, the applicant also has filed a patent application in the United States, as U.S. Pat. application Ser. No. 041,043 (filing date Apr. 21, 1987).

The invention of this application is a further improvement in the invention proposed in the above-mentioned U.S. patent application Ser. No. 041,043.

SUMMARY OF THE INVENTION

Accordingly, an object of the present invention is to provide an illuminating apparatus capable of illuminating an object with a high degree of precision, as well as a recording apparatus making use of the illuminating apparatus.

Another object of the present invention is to provide an illuminating apparatus capable of illuminating a restricted area of a very small width with a high degree of precision, as well as a recording apparatus making use of the illuminating apparatus.

A further object of the present invention is to provide an illuminating apparatus capable of illuminating an object alternately with a plurality of lights of different spectral characteristics while effecting a high-speed switching between these lights, as well as a recording apparatus making use of the illuminating apparatus.

A still further object of the present invention is to provide an illuminating apparatus in which a plurality of paths are provided for lights emitted from fluorescent materials so as to enable a plurality of objects to be illuminated, as well as a recording apparatus making use of the illuminating apparatus.

A still further object of the present invention is to provide an illuminating apparatus having illuminating means which is capable of illuminating both an image reading portion and an image recording portion, as well as a recording apparatus making use of the illuminating apparatus.

A still further object of the present invention is to provide an illuminating apparatus which is suitable for use in such a system that light from illuminating means is applied to an image reading portion and an image recording portion so that the recording is conducted in the recording portion in accordance with the data read from the image reading portion, as well as a recording apparatus making use of the illuminating apparatus.

BRIEF DESCRIPTION OF THE DRAWINGS

FIG. 8 is a graph showing the light-transmitting characteristics of a rotary member;

FIG. 12 is a timing chart showing the timing of illumination and heating;

FIG. 19 is a sequence table showing the sequence of delivery of various signals;

FIG. 20 is a flow chart of the recording operation; and

DESCRIPTION OF THE PREFERRED EMBODIMENTS

The embodiment described hereinunder is an illuminating apparatus having a rotary member provided with at least two types of fluorescent material, driving means for rotating the rotary member; illuminating means for illuminating the fluorescent member; and a plurality of illuminating paths for the light emitted from the fluorescent materials. Described also is an embodiment of a recording apparatus of the invention which is adapted to read image information and to record the read image information on a recording medium, comprising: illuminating means including a rotary member provided with at least two types of fluorescent material, driving means for rotating the rotary member, lighting means for causing said fluorescent materials to emit light, and a plurality of illuminating paths for the light emitted from the fluorescent materials; an image reading section for reading an image through illumination of the image by the light from the illuminating means; an image recording section for recording an image on an imaging member through illumination by light from said illuminating means; and a transfer section for transferring the image formed on the imaging member in the recording section onto a recording medium.

In the illuminating apparatus, the lighting means operates while the rotary member is rotating at a constant speed so that the lights of different wavelengths emitted from the fluorescent materials are switched-over at a high speed and directed to a region of a small width on an object.

In the recording apparatus making use of this illuminating apparatus, the light from the illuminating means is directed both to the image reading section and the recording section through different light paths. Thus, a single illuminating means serves both the image reading section and the image recording section.

A practical embodiment of the illuminating apparatus will be described hereinunder.

Figure 1A:
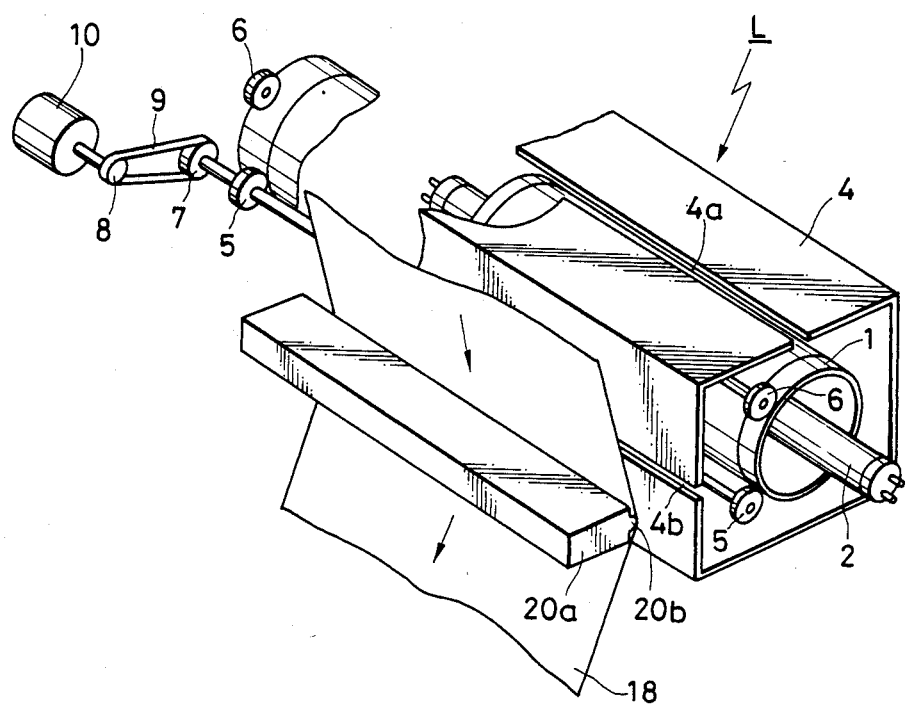
FIG. 1A is a perspective view of an embodiment of the illuminating apparatus in accordance with the present invention.
Figure 1B:
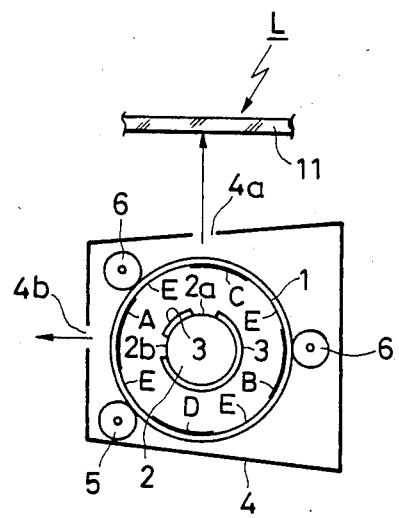
FIG. 1B is a sectional view of the illuminating apparatus shown in FIG. 1A.

FIG. 1A is a perspective view of an illuminating apparatus L having four types of spectral characteristics, while FIG. 1B is a sectional view of the apparatus L.

Referring to these Figures, a cylindrical rotary member 1 which is made of, for example, a quartz glass has an inner surface on which are applied four different fluorescent materials A, B, C and D so as to form four regions of different fluorescent materials and having an equal circumferential length with a small area E devoid of any fluorescent material between each adjacent regions. Thus, each of the regions of fluorescent materials extend over an angle substantially equal to 90°. Among the four different fluorescent materials, the materials A and B are intended for emitting lights for recording, while the materials C and D are intended for emitting light for reading. The arrangement is such that the fluorescent materials A and B diametrically oppose each other, while the fluorescent materials C and D are diametrically opposed by each other.

For instance, the fluorescent materials A and B are $Ca(PO_4):Tl$ and $SrMgP_2O_7:Eu^{2+}$, respectively, while the fluorescent materials C and D are $ClMgAl_{11}O_{19}:Tb^{3+}$ and $BaMg_2Al_{16}O_{27}:Eu^{2+}$. The fluorescent materials A, B, C and D emit lights upon receipt of light from a light source 2 inside the rotary member 1. When a sterilization lamp GL-10 is used as the light source 2, the fluorescent materials A, B, C and D emit lights of spectral distributions as shown in the graph in FIG. 2.

Figure 2:
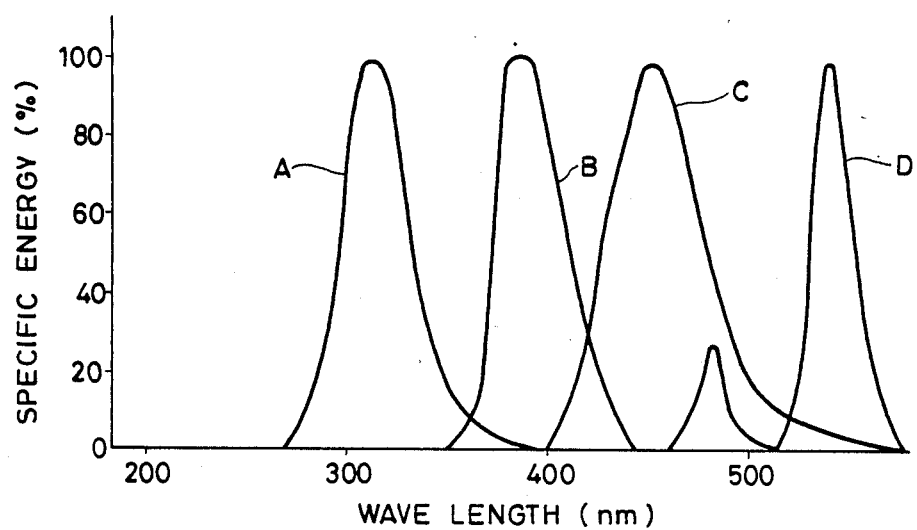
FIG. 2 is a graph showing the spectral characteristics of fluorescent materials.

The surface of the light source 2 is coated with a light-shielding aluminum film 3 formed thereon by evaporation deposition so as to leave linear illuminating portions 2a, 2b so that the light from the light source 2 is applied only through the illuminating portions 2a, 2b. The rotary member 1 is disposed in a light shielding housing 4 which also has slits 4a, 4b at positions corresponding to the illuminating portions 2a, 2b. Thus, there are two light paths for the light from the light source 2: namely, a path which leads to an object to be illuminated through the illuminating portion 2a and the slit 4a, and a path which leads to an object to be illuminated through the illuminating portion 2b and the slit 4b. The illuminating portions 2a and 2b are positioned around the center of the light source 2 in a 90° spaced apart relation to each other. The rotary member 1 is rotatably supported at each end thereof by a drive roller 5 and a pair of idle rollers 6, 6. Thus, each axial end of the rotary member 1 is supported at three points. The drive rollers 5 are power driven by a motor 10 via pulleys 7, 8 and a timing belt 9 stretched between these pulleys 7, 8, whereby the rotary member 1 is rotated. According to this arrangement, when the rotary member 1 is rotated by the motor 10 while the light source 2 is on, the lights emitted from the illuminating portions 2a, 2b excite the fluorescent materials A, B, C and D alternately, whereby an object is illuminated with lights of different spectral characteristics as shown in FIG. 2.

Conventional systems for illuminating an object with lights of different wavelengths usually employ a plurality of fluorescent tubes having different light wavelengths. In consequence, the position from which the illuminating light is emitted differs according to the types or wavelengths of the lights, with the result that the illuminated zone has a considerably large width. In the illustrated embodiment, however, lights of different wavelengths are emitted from the same position, so that a region of an extremely small breadth is illuminated by the lights applied through the slits 4a and 4b. By rotating the rotary member 1 at a high speed, it is possible to effect a high-speed switching between illuminating lights of different spectral characteristics.

A description will be made hereinunder as to a practical embodiment of a recording apparatus which makes use of the illuminating apparatus described above.

Figure 3:
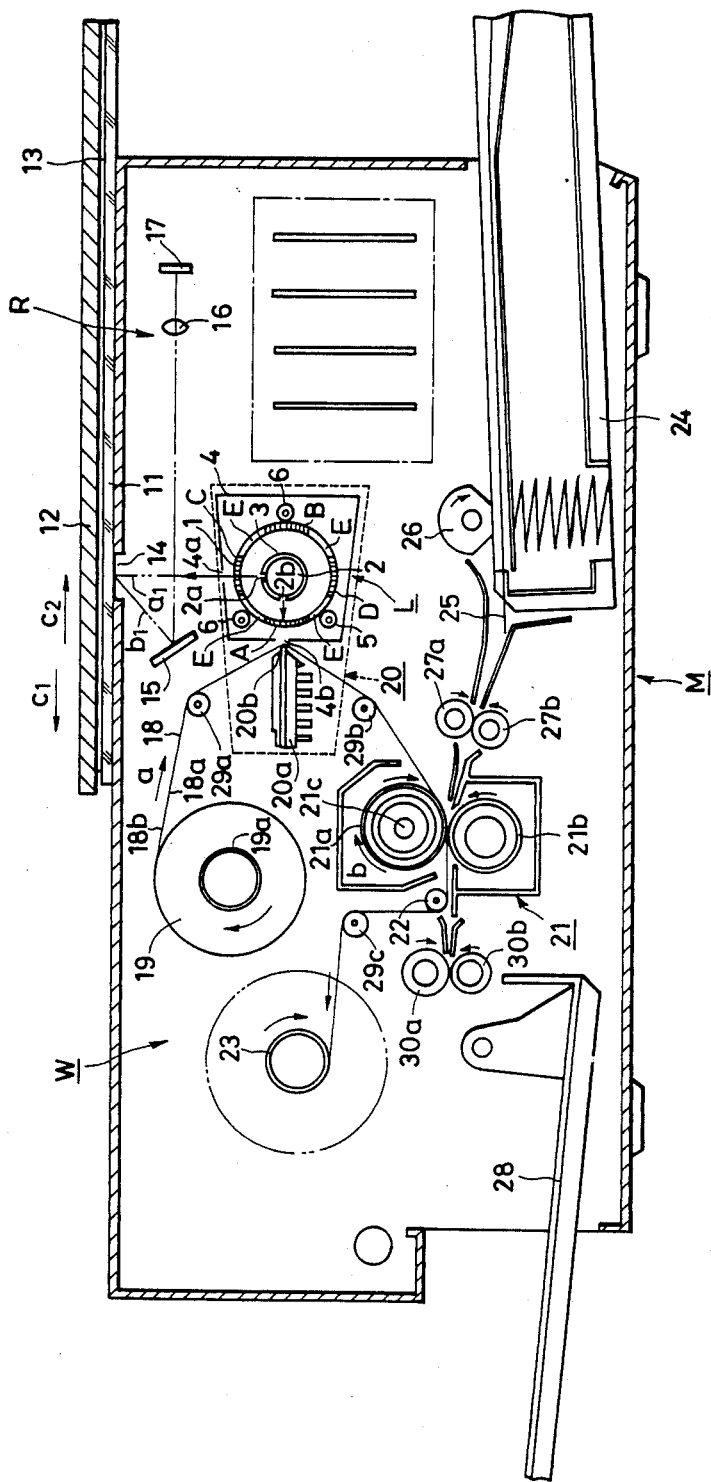
FIG. 3 is a schematic illustration of a recording apparatus making use of the illuminating apparatus.

FIG. 3 is a schematic sectional view of a recording apparatus having a reading system R and a recording system W. The reading system R includes a light-transmitting original table 11 provided on the main part M of the apparatus, and an original retainer 12 placed on the original table 11. The original table 11, with an original 13 held between itself and the original retainer 12, is adapted to move in the directions of arrows C1 and C2. The image-carrying surface of the original 13 is illuminated through a slit 14 in the main part M of the apparatus by a light from the illuminating apparatus L described above as shown by a chain line $a_1$, when the original table 11 together with the original 13 slides in the direction of the arrow C1. The light reflected by the image is directed to a monochromatic line-reading line sensor 17 such as of CCD type, via a mirror 15 and a lens 16, as indicated by a chain line b₁, whereby an image is photo-electrically converted into electric signals which are delivered to the recording system.

The illuminating portion 2a of the light source 2, the slit 4a in the housing 4 and the slit 14 in the main part M of the apparatus are aligned so that the illuminating light from the light source 2 illuminates only a region of an extremely small width on the image-carrying surface of the original 13.

A description will be made hereinunder as to the construction of the recording system W. Referring to FIG. 3, the recording system has an elongated sheet-like transfer recording medium 18 which is demountably set in the main part M of the apparatus in the form of a supply roll 19. More specifically, the supply roll 19 is demountably carried by a rotatable shaft 19a provided on the main part M of the apparatus.

The end of the transfer recording medium 19 is adapted to be taken up by a take-up roll 23 from the supply roll 19, guide roller 29a, recording head 20a, guide roller 29b, the nip between a transfer roller 21a and a pressing roller 21b, a separation roller 22 and a guide roller 29c. The leading end of the transfer recording medium 18 is retained on the take-up roll 23 by a suitable means such as a gripper (not shown). As the take-up roller 23 is driven by a known driving means, the transfer recording medium 18 is fed in the direction of an arrow a and is successively wound on the peripheral surface of the take-up roll 23.

During the taking-up of the transfer recording medium 18, a constant level of back tension is applied to the supply roll 19 by means of, for example, a hysteresis brake. During the feeding, the transfer recording medium 18 is pressed onto a recording head 20a with a predetermined contact pressure and at a predetermined angle, by the back tension and by a force produced by the guide rollers 29a, 29b.

The construction of each portion will be described in more detail. As will be seen from FIG. 4, the transfer recording medium 18 is composed of a sheet-like carrier 18a and a transfer recording layer 18b on the carrier 18a, the transfer recording layer 18b is made of a material which is capable of forming an image by application of heat and light energies thereto.

Figure 4:
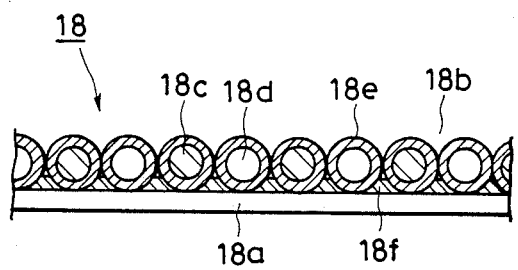
FIG. 4 is a sectional view of a transfer recording medium.

For instance, as shown in FIG. 4, the transfer recording layer 18b is formed by a method which will be explained hereinunder in the form of a layer of microcapsular image forming elements, by making use of materials shown in Tables 1 and 2 as the materials of cores 18c and 18d.

TABLE 1

| Items | Components | wt % |
|---|---|---|
| Polymerizable pre-polymer | (CH₂=CHCOOCH₂.CH₂.O.<br>CO.NH—⟨H⟩₂—CH₂ | 68 |
| Photo-polymerization initiator | Irgacure-184(Ciba-Geigy)/<br>ethyl-p-dimethylaminobenzoate | 2/2 |
| Binder | Elvasite 2041 (Dupont) | 23 |
| Coloring agent | Sumitone Carmine (Sumitomo Chemical Co., Ltd.) | 5 |

TABLE 2

| Items | Components | wt % |
|---|---|---|
| Polymerizable pre-polymer | 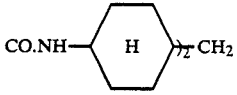 | 68 |
| Photo-polymerization initiator | 2-chlorothioxanthone/<br>ethyl-p-dimethylaminobenzoate | 1.4/2 |
| Binder | Elvasite 2041 (Dupont) | 23.6 |
| Coloring agent | Lionel blue FG-7330 (Toyo Ink Mfg. Ltd.) | 5 |

Each of the compositions shown in Tables 1 and 2 in amount of 10 g was mixed with 20 wt parts of methylene chloride. The mixture was then mixed with 200 ml of water dissolving a surfactant having an HLB value not smaller than 10, e.g., a cation or nonion surfactant, and 1 g of gelatin. The mixture was then stirred by a homo-mixer at 8,000 to 10,000 rpm at 60° C. so as to be emulsified, whereby oil particles of a mean particle size of 26 μm was obtained.

The stirring was further continued for 30 minutes at 60° C. so that the methylene chloride was removed to reduce the mean particle size to 10 μm. Then, 20 ml of water dissolving 1 g of gum arabic was added. The solution was slowly cooled while ammonium hydrate (NH₄OH) was added thereto so as to elevate the pH value up to 11 or higher, whereby a microcapsular slurry was obtained. Then, 1.0 ml of 20% aqueous solution of glutaric aldehyde was added gently so as to cure the capsule walls.

Subsequently, the slurry was subjected to solid-liquid clarification conducted by Nutche funnel, followed by a 10-hour drying in vacuum at 35° C., whereby microcapsular image forming elements were obtained.

Thus, microcapsular image forming elements having cores 18c, 18d of the compositions shown in Tables 1 and 2 and coated by shells 18e were obtained to have particle sizes ranging between 7 and 15 μm with the mean value of 10 μm.

To explain in more detail, an adhesive 18f was prepared by dissolving 1 cc of polyester adhesive POLYESTER LP-022 (solid content 50%) produced by Nippon Synthetic Chemical Industries Co., Ltd in 3 cc of toluene. The adhesive 18f was applied to a carrier 18a having a thickness of 6 μm and made of polyethylene terephthalate. After drying of the solvent, the thickness of the film was measured to be about 1 μm. Since the adhesive 18f had a glass transition point of −15° C., delicate tackiness remained even after cooled to the room temperature so that the image forming elements prepared by the described method can easily be attached to the carrier 18a.

The microcapsular image forming elements having cores made from the compositions shown in Tables 1 and 2 were mixed at a ratio of 1:1, and were sprayed onto the layer of the adhesive 18f so as to be adhered to the latter. Subsequently, unnecessary or excessive image forming elements were cast off, whereby the image forming elements were retained on the adhesive layer in the form of a single layer at a rate of about 90%.

Then, a pressure of about 1 kgf/cm² and heat energy of about 80° C. were applied to the image forming elements so as to strongly fix the image forming elements onto the carrier 18a, whereby the transfer recording medium 18 was prepared.

Figure 5:
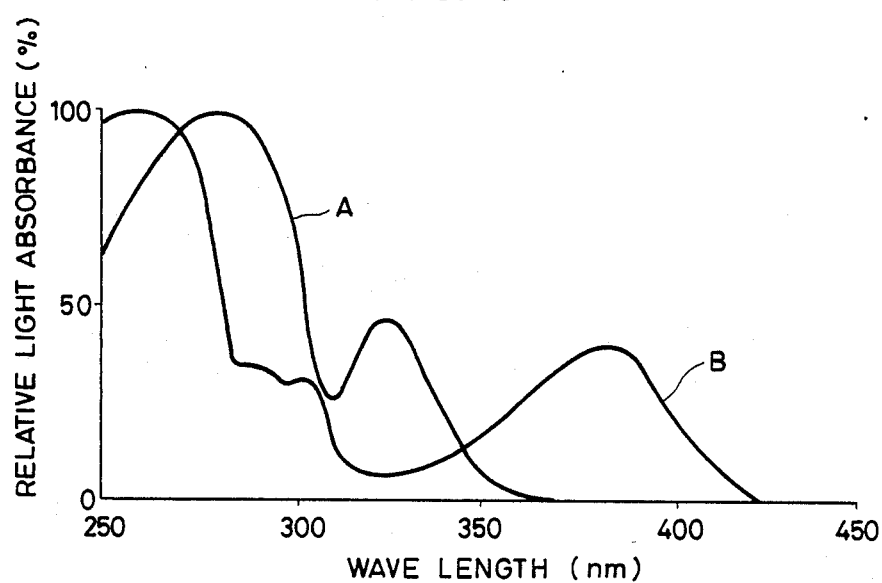
FIG. 5 is a graph showing the light absorption characteristics of the transfer recording medium.

The photo-polymerization initiator in the composition of the image forming element as shown in Table 1 initiates reaction upon absorption of a light of a wavelength characteristic A in FIG. 5, so as to exhibit magenta color in the formation of an image. On the other hand, the photopolymerization initiator in the composition of the image forming element as shown in Table 2 initiates reaction upon absorption of a light of a wavelength characteristic B in FIG. 5, so as to exhibit blue color in the formation of an image.

A description will be made hereinunder as to the recording unit 20. The recording unit 20 is mainly constituted by heating means and illuminating means.

The heating means includes a line-type heat generator composed of a row 20b of heat generating elements arranged on the surface of a recording head 20a and having a length corresponding to the size of A-4 size paper. The heat-generating elements are independently controllable for heat generation and are arranged in the form of discrete dots at a pitch of 8 dots/mm. As explained before, during the feed of the transfer recording medium 18, a back tension acting in the carrier 18a of the transfer recording medium 18 serves to press the carrier 18a of the medium 18 onto the row 20b of heat generating elements at a predetermined pressure. In this embodiment, the image signals are issued from the reading sensor 17.

On the other hand, the aforementioned illuminating means L is disposed on the same side of the transfer recording medium 18 as the transfer recording layer 18b which faces the recording head 20a. In the illuminating apparatus L, the illuminating portion 2b of the light source 2, the slit 4b of the housing 4, and the row 20b of the heat-generating elements are disposed on a common straight line, so that only the region of an extremely small width of the medium 18 immediately on the row 20b of the heat generating elements of the recording head 20a are illuminated by light.

A description will be made as to a transfer unit 21. The transfer unit 21 is disposed downstream from the recording unit 20 as viewed in the direction of feed of the transfer recording medium 18. As shown in FIG. 3, the transfer unit 21 includes a transfer roller 21a which is driven to rotate in the direction of an arrow b and a pressing roller 21b held in pressure contact with the transfer roller 21a. The transfer roller 21a is constituted by an aluminum roller the surface of which is coated with a silicone rubber layer of 1 mm thick and 70 deg. in hardness. The transfer roller 21a accommodates a halogen heater 21c of 800 W output so that the surface of the transfer roller 21a is always maintained at 90° to 100° C.

The pressurizing roller 21b also is constituted by an aluminum roller having a surface coating layer of silicone rubber which is 70 deg. in hardness and 1 mm in thickness. The pressing roller 21b is resiliently pressed onto the transfer roller 21a with a force of 6 to 7 kgf/cm by a suitable pressing means such as a spring (not shown).

A sheet of recording paper 25 as a recording member loaded in a cassette 24 is fed to the transfer unit 21 in synchronization with the transfer recording medium 18 such as to overlap the image region on the transfer recording medium 18 by means of a feed roller 26 and a pair of register rollers 27a, 27b. One 27a of the pair of register rollers is power driven. A one-way clutch (not shown) is provided on the shaft of the register roller 27a so as to allow the roller 27a to rotate freely in the direction for forwarding the sheet towards the transfer unit 21.

A description will be made hereinunder as to the operation of the reading system R and the recording system W. In the following description of the embodiment, it is assumed that the recording is done by heat modulated in accordance with image signals while the light is applied uniformly.

Figure 6:
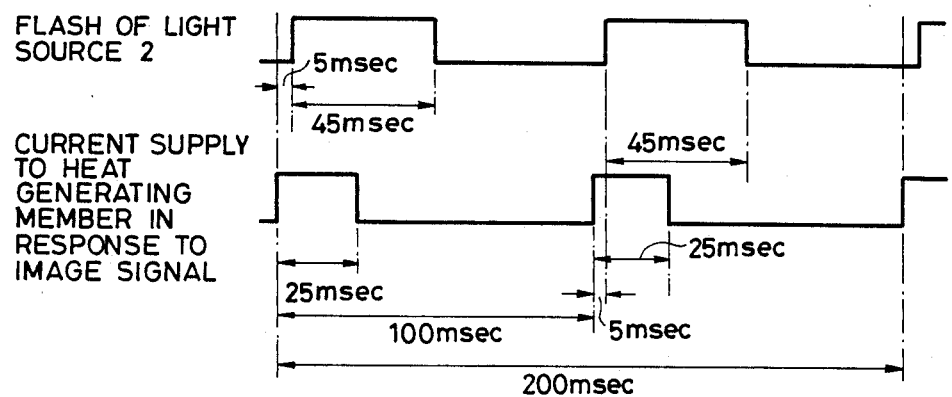
FIG. 6 is a timing chart showing the timing at which light and heat are applied to the transfer recording medium.

The original table 11 carrying the original 13 thereon is made to slide while the rotary member 1 of the illuminating apparatus L rotates at 300 rpm. At the same time, the light source 2 is made to flicker at a timing shown in FIG. 6. As a result, the light emitted from the fluorescent materials A and B are directed through the slit 4b so as to illuminate the transfer recording layer 18b. The rotation of the rotary member 1 and the flicker of the light source 2 are synchronized such that the light emitted from the fluorescent materials C, D are directed through the slit 4a so as to illuminate the original 13.

The original 13 is thus illuminated and the light reflected by the original 13 is converted by the reading sensor 17 into electrical image signals which are delivered to the recording system W.

Simultaneously with the reading, a motor (not shown) is started to supply the transfer recording medium 18 successively from the supply roll 19. Then, light and heat are applied in accordance with the image signals to the transfer recording layer 18b of the transfer recording medium 18 in the recording unit 20, whereby an image is formed.

More specifically, the transfer recording layer 18b has such characteristic that its softening temperature rises when a light of a predetermined wavelength together with heat is applied thereto, so that the transfer characteristics is irreversibly changed to prevent transfer of image to the recording paper 25. Thus, as will be seen from the timing chart in FIG. 6, in recording an image in magenta color, the heat generating elements amongst the row 20b of the heat-generating elements are not supplied with electric current, but the heat generating elements corresponding to white color (assumed to be the same as color of the recording paper 25) of image are supplied with the electric power for a time period of 25 ms. Then, the light source 2 is activated for 45 ms with a delay of 5 ms to the supply of the power to the heat generating elements corresponding to the white color. The timings of operation are so determined that at this moment the transfer recording layer 18b is illuminated with the light emitted from the fluorescent material A. It is also to be understood that, while the transfer recording layer 18b is illuminated by the light from the fluorescent material A, the original 13 is illuminated by the light emitted from the fluorescent material C.

The recording of image of blue color is conducted as follows. After elapse of 50 ms from the completion of illumination, i.e., when 100 ms has passed from the moment of start of the electric power supply, the heat generating elements of the row 20b corresponding to white image signals are energized for 25 ms while the heat generating elements corresponding to the blue image signals are not energized. Then, with a time lag of 5 ms therefrom, the light source 2 is activated for 45 ms so that the transfer recording layer 18b is illuminated by the light from the fluorescent material B. During the illumination of the transfer recording layer 18b with the light from the fluorescent material B, the original 13 is illuminated by the light emitted from the fluorescent material D.

The generation of heat in the recording head 20a is controlled in the described manner in accordance with blue, magenta and white image signals, whereby a negative image is formed in the transfer recording layer 18b. The transfer recording medium 18 is fed in synchronization at a repetitional period of 200 ms/line. Furthermore, in the transfer unit 21, the transfer recording layer 18b carrying the negative image is pressed onto the recording paper 25 under application of heat, whereby a two-color image of blue and magenta is transferred to the recording paper 25. Subsequently, the transfer recording medium 18 and the recording paper 25 are separated from each other by the separation roller 22, and the recording paper 25 carrying an image of desired colors formed thereon is discharged to a discharge tray 28 by means of a pair of discharge rollers 30a, 30b.

Two-color recording of an image is thus completed in one-shot manner.

The embodiment will be described in more detail with reference to FIGS. 7 to 21. The embodiment which will be described hereinunder is an image recording apparatus which is capable of reading an image information from an original and forming the record of the read image information on a recording member.

In this embodiment, fluorescent materials are made to illuminate white the rotary member is rotated at a constant speed so that lights of different wavelengths from different fluorescent materials are switched-over at a high speed and are made to simultaneously illuminate the image reading portion and the image recording portion of the image recording apparatus.

Figure 7A:
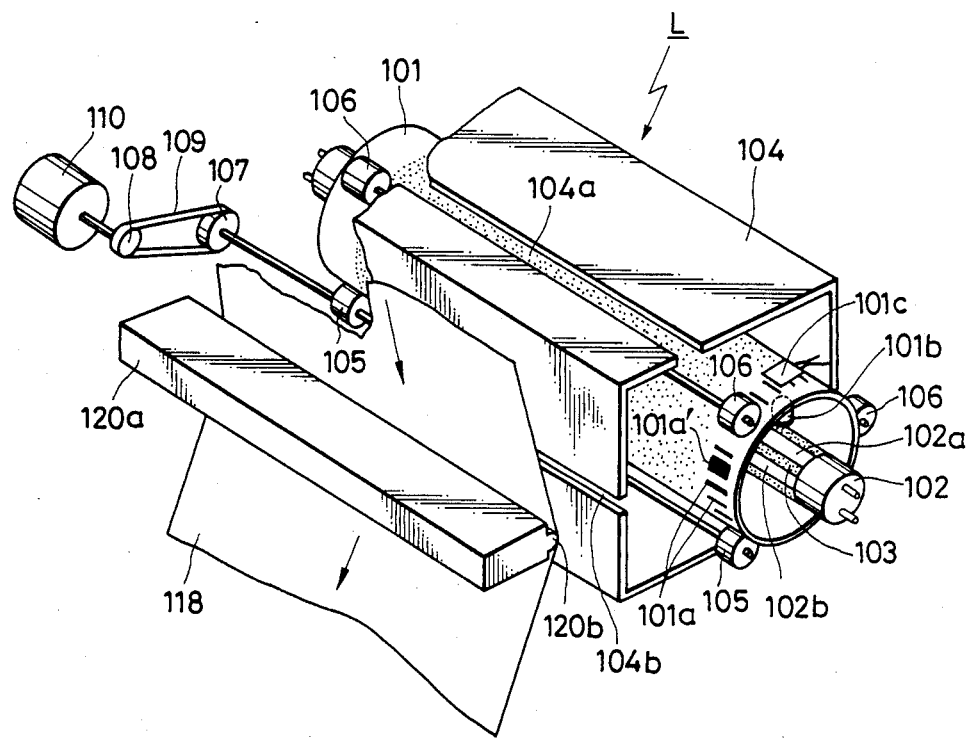
FIG. 7A is a perspective view of illuminating apparatus.
Figure 7B:
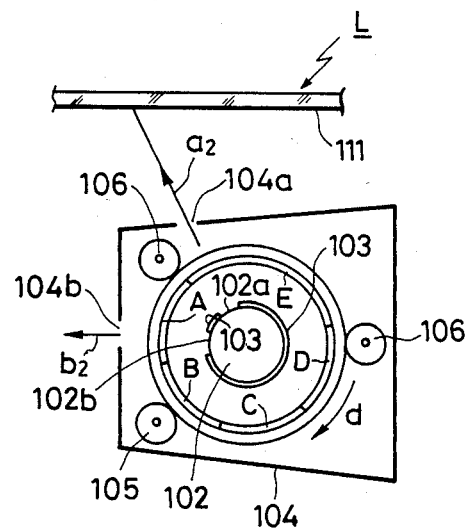
FIG. 7B is a sectional view of the illuminating apparatus shown in FIG. 7A.

FIG. 7A is a perspective view of an illuminating apparatus L having five types of spectral characteristics, while FIG. 7B is a sectional view of the same. Referring to these Figures, a numeral 101 designates a cylindrical rotary member having a wall thickness of 2 mm and made of a material DURAN 50 from SCHOTT Company, West Germany. Five types of fluorescent materials A, B, C, D and E are applied to the inner surface of the rotary member 101 over angular regions of 60°, 60°, 60°, 60° and 120°. Among the five types of fluorescent materials, the materials A and C are intended for emitting lights for recording, while the materials B and D are for emitting lights for reading. The fluorescent material E is intended for emitting light which serves both for recording and reading.

Examples of the fluorescent materials are as follows.

The fluorescent material A may be constituted mainly by $Ca(PO_4):Tl$ (thallium-activated calcium phosphate), while the fluorescent material B may be constituted mainly by $(Sr, Mg)_2P_2O_7:Eu$ (europium activated strontium magnesium pyrophosphate). The fluorescent material c may be mainly constituted by $LaPO_4:Ce, Tb$ (selenium-,terbium-activated lanthanum phosphate). The fluorescent material D may be mainly constituted by $Y_2O_3:Eu$ (Europium-activated yttrium oxide). Finally, the fluorescent material E may be constituted mainly by $Ba, MgAl_{16}O_{27}:Eu$ (europium-activated barium magnesium aluminate).

These fluorescent materials A,B,C,D and E are luminous upon receipt of light from a light source 102 provided inside the rotary member 101. For instance, when a sterilization lamp GL-10 is used as the light source 102, the fluorescent materials A, B, C, D and E emit lights having spectral distributions as shown by curves A (peak wavelength about 335 nm), B (peak wavelength about 543 mm). C (peak wavelength about 390 nm), D (peak wavelength about 611 nm) and E (peak wavelength about 451 nm).

The surface of the light source 102 is wholly coated by evaporation with an aluminum film 103 except for two linear slit-like portions 102a, 102b constituting linear illuminating portions through which illuminating lights are directed to an object. The rotary member 101 is housed in a light-shielding housing 104 which is provided with slits 104a, 104b at portions corresponding to the illuminating portions 102a and 102b of the light source 102. Thus, two paths of light are formed: namely, a light path $a_2$ through which an object is illuminated by the light from the light source 102 via the illuminating portion 102a and the slit 104a, and a light path $b_2$ through which an object is illuminated by the light from the light source 102 via the illuminating portion 102b and the slit 104b.

Figure 9:
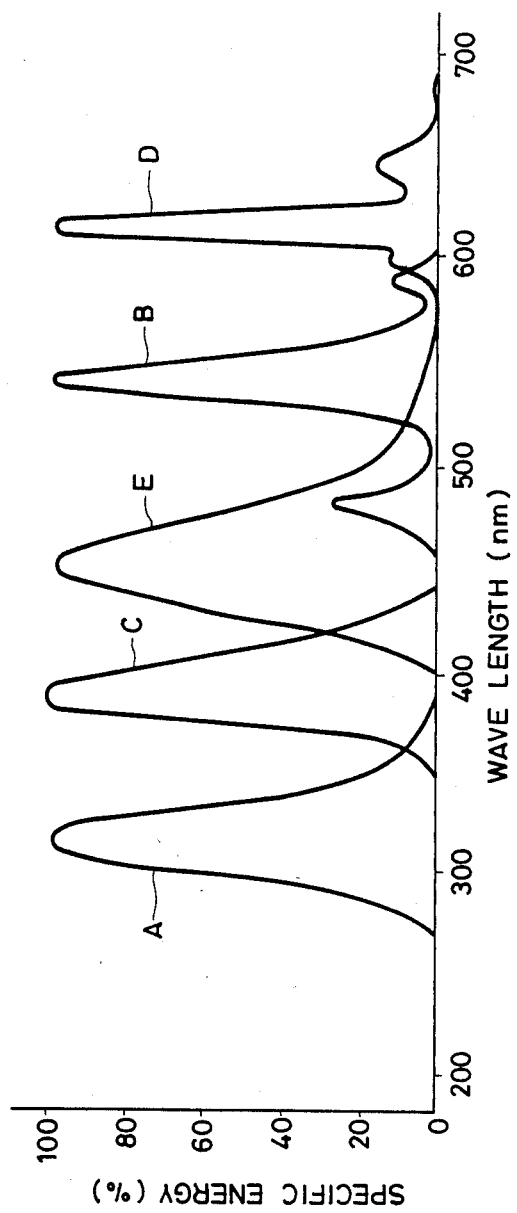
FIG. 9 is a graph showing the spectral characteristics of illuminating means.
Figure 10:
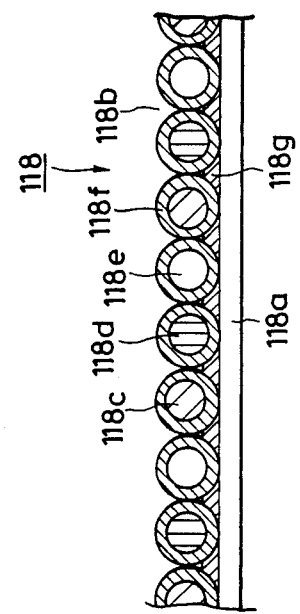
FIG. 10 is an illustration of the construction of the transfer recording medium.

The rotary member 101 is rotatably supported at each end thereof by a drive roller 105 and a pair of idle rollers 106, 106. Thus, each axial end of the rotary member 101 is supported at three points. The drive rollers 105 are power driven by a motor 110 via pulleys 107, 108 and a timing belt 109 stretched between these pulleys 107, 108, whereby the rotary member 110 is rotated. According to this arrangement, when the rotary member 110 is rotated by the motor 110 while the light source 102 is on, the lights emitted from the illuminating portions 102a, 102b excite the fluorescent materials A, B, C, D and E alternately, whereby the respective objects are illuminated with lights of different spectral characteristics as shown in FIG. 9, through the slits 104a, 104b.

Conventional systems for illuminating an object with lights of different wavelengths usually employ a plurality of fluorescent tubes having different light wavelengths. In consequence, the position from which the illuminating light is emitted differs according to the types or wavelengths of the lights, with the result that the illuminated zone has a considerably large width. In the illustrated embodiment, however, lights of different wavelengths are emitted from the same position, so that a region of an extremely small breadth is illuminated by the lights applied through the slits 104a and 104b. By rotating the rotary member 1 at a high speed, it is possible to effect a high-speed switching between illuminating lights of different spectral characteristics.

In order to control the rotation speed and phase of the rotary member 101 in a manner which will be described later, a multiplicity of light-shielding portions 101a in the form of stripes of a constant interval are formed along the circumference of the rotary member 101. One 101a' of the light shielding portion 101a has a breadth other than that of others. A light-emitting member 101b such as an LED disposed inside the rotary member 101 and a light-receiving member 101c such as a photo-diode placed outside the rotary member 101 oppose each other across the light-shielding portions 101a.

A description will be made hereinunder as to a practical embodiment of a recording apparatus which makes use of the illuminating apparatus described above.

Figure 7C:
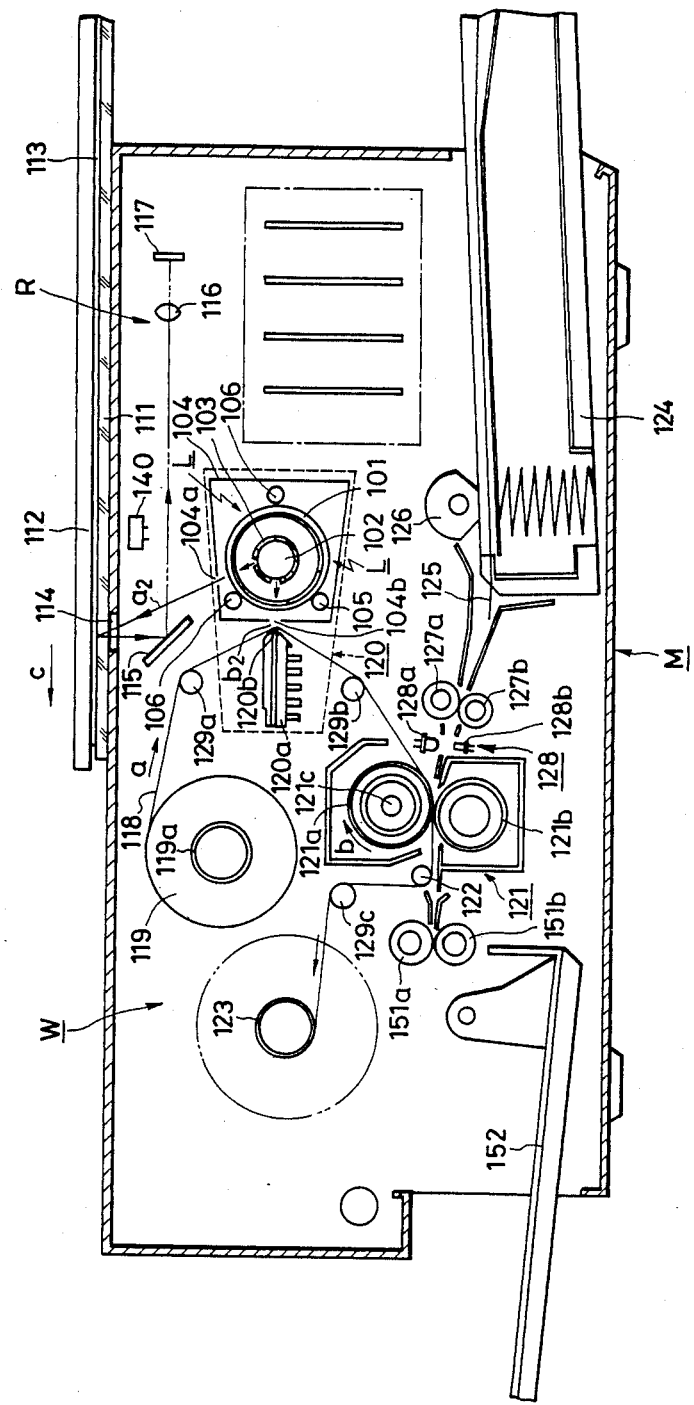
FIG. 7C is a schematic cross sectional view of an apparatus having image reading poriton R and image recording portion W.

FIG. 7C is a schematic sectional view of a recording apparatus having a reading system R and a recording system W. The reading system R includes a light-transmitting original table 111 provided on the main part M of the apparatus, and an original retainer 112 placed on the original table 111. The original table 111, with an original 113 held between itself and the original retainer 112, is adapted to move in the directions of an arrow C (see FIG. 7C) by forward rotation of a reading motor 143 (see FIG. 15). When the motor 143 is reversed, the original table 111 also is moved in the direction opposite to the arrow C. A reading register sensor 140 disposed at a suitable position is capable of detecting that the original table 111 is stationed at an original reading start position.

The image-carrying surface of the original 113 is illuminated through a slit 114 in the main part M of the apparatus by a light from the illuminating apparatus L disposed under the original table 111, when the original table 111 together with the original 113 slides in the direction of the arrow C. The light reflected by the image is directed to a monochromatic line-reading line sensor 117 such as of CCD type, via a mirror 115 and a lens 116, whereby an image is photo-electrically converted into electric signals which are delivered to the recording unit 120 which will be mentioned later.

The illuminating portion 102a of the light source 102, the slit 104a in the housing 104 and the slit 114 in the main part M of the apparatus are aligned so that the illuminating light from the light source 102 illuminates only a region of an extremely small width on the image-carrying surface of the original 113.

A description will be made hereinunder as to the construction of the recording system W. Referring to FIG. 7C, the recording system has an elongated sheet-like transfer recording medium 118 which is demountably set in the main part M of the apparatus in the form of a supply roll 119. More specifically, the supply roll 119 is demountably carried by a rotatable shaft 119a provided on the main part M of the apparatus.

The end of the transfer recording medium 119 is adapted to be taken up by a take-up roll 123 from the supply roll 119, guide roller 129a, recording head 120a, guide roller 129b, the nip between a transfer roller 121a and a pressing roller 121b, a separation roller 122 and a guide roller 129c. The leading end of the transfer recording medium 118 is retained on the take-up roll 123 by a suitable means such as a gripper (not shown). As the take-up roller 123 is driven by a known driving means, the transfer recording medium 118 is fed in the direction of an arrow a and is successively wound on the peripheral surface of the take-up roll 123.

During the taking-up of the transfer recording medium 118, a constant level of back tension is applied to the supply roll 119 by means of, for example, a hysteresis brake. During the feeding, the transfer recording medium 118 is pressed onto a recording head 120a with a predetermined contact pressure and at a predetermined angle, by the back tension and by a force produced by the guide rollers 129a, 129b.

The construction of each portion will be described in more detail. As will be seen from FIG. 10, the transfer recording medium 118 is composed of a sheet-like carrier 118a and a transfer recording layer 118b on the carrier 118a, the transfer recording layer 118b is made of a material which is capable of forming an image by application of heat and light energies thereto.

For instance, as shown in FIG. 4, the transfer recording layer 118b is formed by a method which will be explained hereinunder in the form of a layer of microcapsular image forming elements, by making use of materials shown in Tables 3, 4 and 5 as the materials of cores 118, 118d and 118e.

TABLE 3

| Items | Components | wt % |
|---|---|---|
| Polymerizable monomer | Reaction product of p-cyclohexyldiisocyanate and hydroxypropylacrylate | 60 |
| Binder | chlorinated polyethylene | 30 |
| Photo-polymerization initiator | 4-4'dimethoxybenzyl | 1.5 |
| Amine | ethyl-p-dimethylaminobenzoate | 1.5 |
| Coloring agent | Brilliant Carmine 6B-NS (Toyo Ink Mfg. Ltd.) | 7 |

TABLE 4

| Items | Components | wt % |
|---|---|---|
| Polymerizable monomer | Reaction product of p-cyclohexyldiisocyanate and hydroxypropylacrylate | 60 |
| Binder | chlorinated polyethylene | 30 |
| Photo-polymerization initiator | 2-chlorothioxanthone | 1.5 |
| Amine | phenyl-p-diethylaminobenzoate | 1.5 |
| Coloring agent | Cyanine Blue RNF (Toyo Ink Mfg. Ltd.) | 5 |

TABLE 5

| Items | Components | wt % |
|---|---|---|
| Polymerizable monomer | reaction product of p-cyclohexyldiisocyanate and hydroxypropylacrylate | 62 |
| Binder | chlorinated polyethylene | 30 |
| Photo-polymerization initiator | 3,3 carbonyl bis(7-diethylaminocoumarin)/ | 1.5 |
| | tris 2,4,6-(trichloromethyl)S—triazine | 1.5 |
| Coloring agent | Lionel Yellow SS-OW (Toyo Ink Mfg. Ltd.) | 5 |

Each of the compositions shown in Tables 3, 4 and 5 in amount of 10 g was mixed with 20 wt parts of methylene chloride. The mixture was then mixed with 200 ml of water dissolving a surfactant having an HLB value not smaller than 10, e.g., a cation or nonion surfactant, and 1 g of gelatin. The mixture was then stirred by a homo-mixer at 8,000 to 10,000 rpm at 60° C. so as to be emulsified, whereby oil particles of a mean particle size of 26 μm was obtained.

The stirring was further continued for 30 minutes at 60° C. so that the methylene chloride was removed to reduce the mean particle size to 10 μm. Then, 20 ml of water dissolving 1 g of gum arabic was added. The solution was slowly cooled while ammonium hydrate (NH4OH) was added thereto so as to elevate the pH value up to 11 or higher, whereby a microcapsular slurry was obtained. Then, 1.0 ml of 20% aqueous solution of glutaric aldehyde was added gently so as to cure the capsule walls.

Subsequently, the slurry was subjected to solid-liquid clarification conducted by Nutche funnel, followed by a 10-hour drying in vacuum at 35° C., whereby microcapsular image forming elements were obtained.

Thus, microcapsular image forming elements having cores 118c, 118d and 118e of the compositions shown in Tables 3, 4 and 5 and coated by shells 18f were obtained to have particle sizes ranging between 7 and 15 μm with the mean value of 10 μm.

The thus formed image forming elements were adhered by an adhesive 118g onto the carrier 118a, thereby obtaining the transfer recording medium 118.

To explain in more detail, an adhesive 118g was prepared by dissolving 1 cc of polyester adhesive POLYESTER LP-022 (solid content 50%) produced by Nippon Synthetic Chemical Industries Co., Ltd in 3 cc of toluene. The adhesive 18g was applied to a carrier 118a having a thickness of 6 $\mu$m and made of polyethylene terephthalate. After drying of the solvent, the thickness of the film was measured to be about 1 $\mu$m. Since the adhesive 18f had a glass transition point of $-15°$ C., delicate tackiness remained even after cooled to the room temperature so that the image forming elements prepared by the described method can easily be attached to the carrier 118a.

The microcapsular image forming elements having cores made from the compositions shown in Tables 3, 4 and 5 were mixed at a ratio of 1:1:1, and were sprayed onto the layer of the adhesive 18f so as to be adhered to the latter. Subsequently, unnecessary or excessive image forming elements were cast off, whereby the image forming elements were retained on the adhesive layer 118g in the form of a single layer at a rate of about 90%.

Then, a pressure of about 1 kgf/cm$^2$ and heat energy of about 80° C. were applied to the image forming elements so as to strongly fix the image forming elements onto the carrier 118a, whereby the transfer recording medium 118 was prepared.

Figure 11:
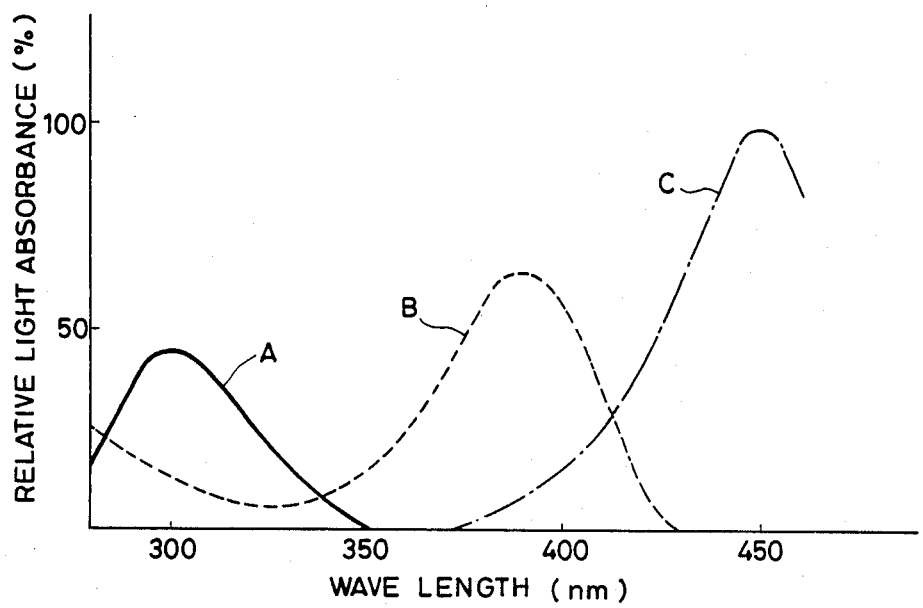
FIG. 11 is a graph showing the light absorption characteristics of the transfer recording layer.

The photo-polymerization initiator in the composition of the image forming element as shown in Table 3 initiates reaction upon absorption of a light of a wavelength characteristic A (peak wavelength 298 nm) in FIG. 11, so as to exhibit magenta color in the formation of an image. On the other hand, the photo-polymerization initiator in the composition of the image forming element as shown in Table 4 initiates reaction upon absorption of a light of a wavelength characteristic B (peak wavelength 389 nm) in FIG. 11, so as to exhibit cyan color in the formation of an image. The photo-polymerization initiator in the composition of the image forming element as shown in Table 5 initiates reaction upon absorption of a light of a wavelength characteristic C (peak wavelength 458 nm) in FIG. 11, so as to exhibit yellow color in the formation of an image.

A description will be made hereinunder as to the recording unit 120. The recording unit 120 is mainly constituted by heating means for applying heat energy to the transfer recording medium 118 and illuminating means for applying light energy to the same.

The heating means includes a line-type heat generator composed of a row 120b of heat generating elements arranged on the surface of a recording head 120a and having a length corresponding to the size of A-4 size paper. The heat-generating elements are independently controllable for heat generation and are arranged in the form of discrete dots at a pitch of 8 dots/mm. As explained before, during the feed of the transfer recording medium 118, a back tension acting in the transfer recording medium 118 serves to press the carrier 118a of the medium 118 onto the row 120b of heat generating elements at a predetermined pressure. In this embodiment, the image signals are obtained by binary coding the signals obtained by amplifying the output of the line sensor 117.

On the other hand, the aforementioned illuminating means L is disposed on the same side of the transfer recording medium 118 as the transfer recording layer 118b which faces the recording head 120a. In the illuminating apparatus L, the illuminating portion 102b of the light source 102, the slit 104b of the housing 104, and the row 120b of the heat-generating elements are disposed on a common straight line, so that only the region of an extremely small width of the medium 118 immediately on the row 120b of the heat generating elements of the recording head 120a are illuminated by light.

A description will be made as to a transfer unit 121. The transfer unit 121 is disposed downstream from the recording unit 120 as viewed in the direction of feed of the transfer recording medium 118. As shown in FIG. 7C, the transfer unit 121 includes a transfer roller 121a which is driven to rotate in the direction of an arrow b by a transfer motor and a pressing roller 121b held in pressure contact with the transfer roller 121a. The transfer roller 121a is constituted by an aluminum roller the surface of which is coated with a silicone rubber layer of 1 mm thick and 70 deg. in hardness. The transfer roller 121a accommodates a halogen heater 121c of 800 W output so that the surface of the transfer roller 121a is always maintained at 90° to 100° C.

The pressurizing roller 121b also is constituted by an aluminum roller having a surface coating layer of silicone rubber which is 70 deg. in hardness and 1 mm in thickness. The pressing roller 121b is resiliently pressed onto the transfer roller 121a with a force of 6 to 7 kgf/cm by a suitable pressing means such as a spring (not shown).

A sheet of recording paper 125 as a recording member loaded in a cassette 124 is fed to the transfer unit 121 in synchronization with the transfer recording medium 118 such as to overlap the image region on the transfer recording medium 118 by means of a feed roller 126 and a pair of register rollers 127a, 127b. One 127a of the pair of register rollers is power driven. A one-way clutch (not shown) is provided on the shaft of the register roller 127a so as to allow the roller 127a to rotate freely in the direction for forwarding the sheet towards the transfer unit 121. In FIG. 7C, a numeral 128 designates a register sensor composed of a light-emitting element 128a and a light-receiving element which cooperate with each other in detecting the leading end of the recording paper 125.

A description will be made hereinunder as to the operation of the reading system R and the recording system W. In the following description of the embodiment, it is assumed that the recording is done by heat modulated in accordance with image signals while the light is applied uniformly.

The original table 111 carrying the original 113 thereon is made to slide in the direction of arrow C in FIG. 7C, while the rotary member 101 of the illuminating apparatus L rotates at 250 rpm. At the same time, the light source 2 is made to flicker at a timing shown in FIG. 12. As a result, the light emitted from the fluorescent materials A,C,E are directed through the slit 104a so as to illuminate the transfer recording layer 118b. The rotation of the rotary member 1 and the flicker of the light source 2 are synchronized such that the light emitted from the fluorescent materials E,B,D are directed through the slit 104a so as to illuminate the original 113.

Figure 13A:
FIGS. 13A and 13B are waveform charts showing the waveform of a signal output from a light-receiving capable of detecting the rotation of the rotary member and the waveform of a signal obtained by integrating the output from the light-receiving member.

In order to attain the above-mentioned synchronism, the speed and phase of the rotary member 101 are controlled in a manner which will be explained hereinunder. As explained before, the rotary member 101 is provided with light-shielding portions 101a. Therefore, when the rotary member 101 rotates at a constant speed, the light-receiving member 101c produces a series of signals as shown in FIG. 13A. In FIG. 13A, the level "Low" is the level of the signal obtained when the light from the light-emitting member 101b is received by the light-receiving member 101c through the rotary member 101, whereas the level "High" is the level of the signals when the light is interrupted by the light-shielding portion 101a and, hence, not received by the light-receiving element. Thus, the frequency of the rising edges of this signal represents the speed of rotation of the rotary member 101 so that the speed of the rotary member 101 can be controlled through detecting this frequency.

Figure 13B:

FIG. 13B shows signals obtained through integration of the signals shown in FIG. 13A. It will be seen that the height of the integrated signal corresponding to the light-shielding portion 101a' having a greater width than others is higher than other integrated signals. It is possible to control the phase of the rotation of the rotary member by using the timing of the high level of the integrated signals. Namely, the turning on and off of the light source 102 is controlled in phase synchronization with the rotation of the rotary member 1 such that the light source 2 is turned on when one of the fluorescent materials A,C and E faces the illuminating portion 102b, while one of the fluorescent materials E,B and D faces the other illuminating portion 102a.

Figure 14:
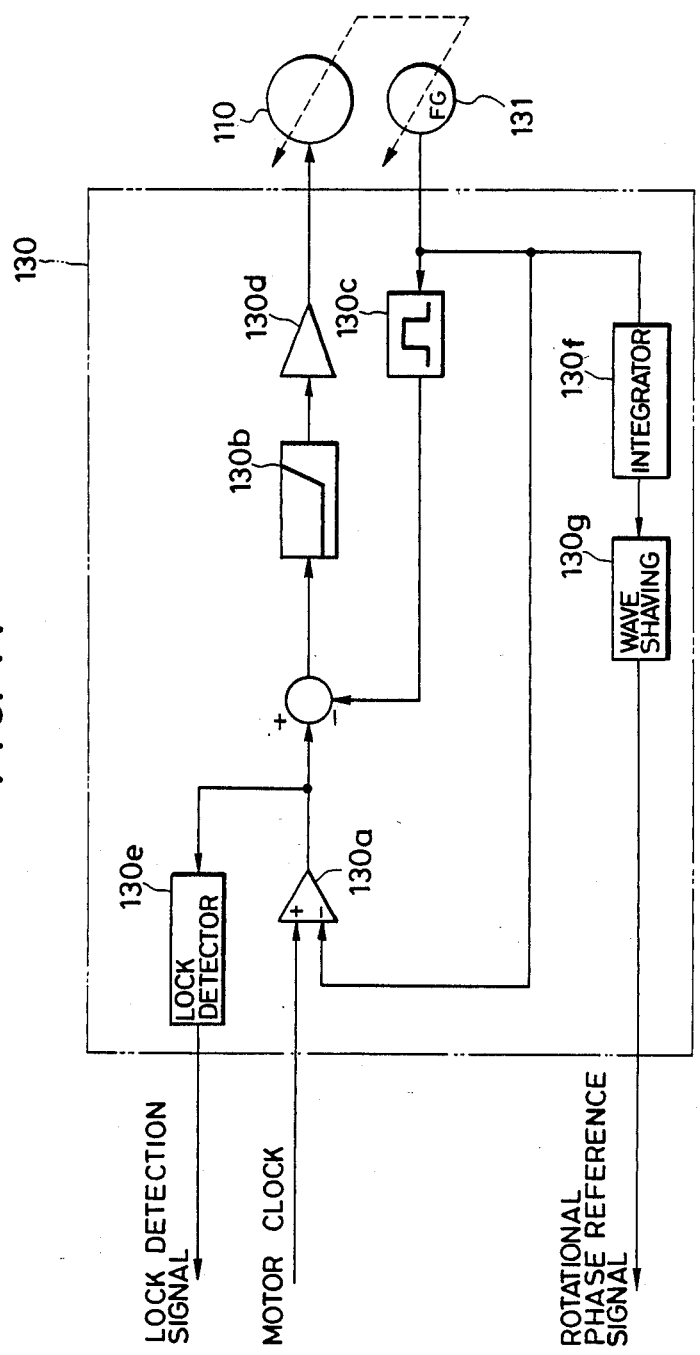
FIG. 14 is an illustration of the construction of a PLL motor driver.

In this embodiment, a PLL (Phase Locked Loop) motor driver 130 is used in order to enable the rotary member 101 to rotate at a constant speed in a given phase of rotation. An example of the control system employing the PLL motor driver will be explained with reference to a block diagram shown in FIG. 14. As will be seen from this Figure, the control circuit is composed of a VCO (Voltage Control Oscillator), a phase comparator 130a and a low-pass filter 130b. In FIG. 14, a light source motor 110 and the FG (Frequence Generator) as the output from the light-receiving member 131 in combination constitute the VCO.

In the arrangement shown in FIG. 14, the phase comparator 130a produces a phase comparison output representing the phase difference between the output of the FG 131 and the motor clock. In order to attain a higher stability of the system, the output of the FIG. 131 is frequency-voltage converted by a mono-stable multivibrator 130c and the difference between the output of the monostable multivibrator 130c and the output of the phase comparator 130a is delivered to the VCO through a low-pass filter 130b and a power amplifier 130d. In FIG. 14, a lock detector 130e is intended for detecting whether the system is in the synchronized state, from the output of the phase comparator 130a. The output of the FG 131 is integrated by the integrator 130f the output waveforms (corresponding to waveforms shown in FIG. 13B) of which are shaped by a wave shaping circuit 130g, whereby a rotation phase reference signals is obtained.

Figure 16A:
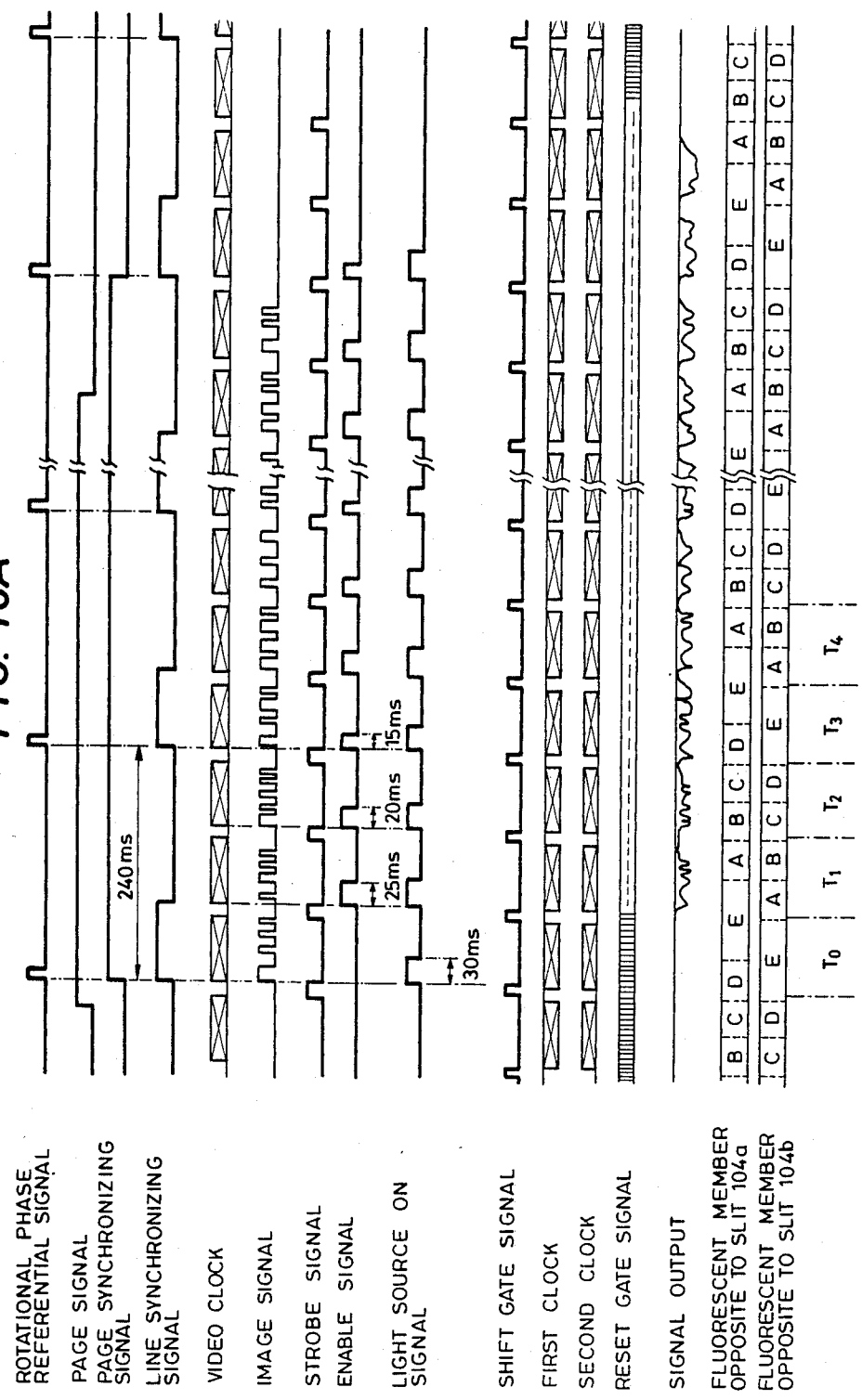
FIGS. 16A, 16B and 17 are timing charts showing recording operation.
Figure 16B:
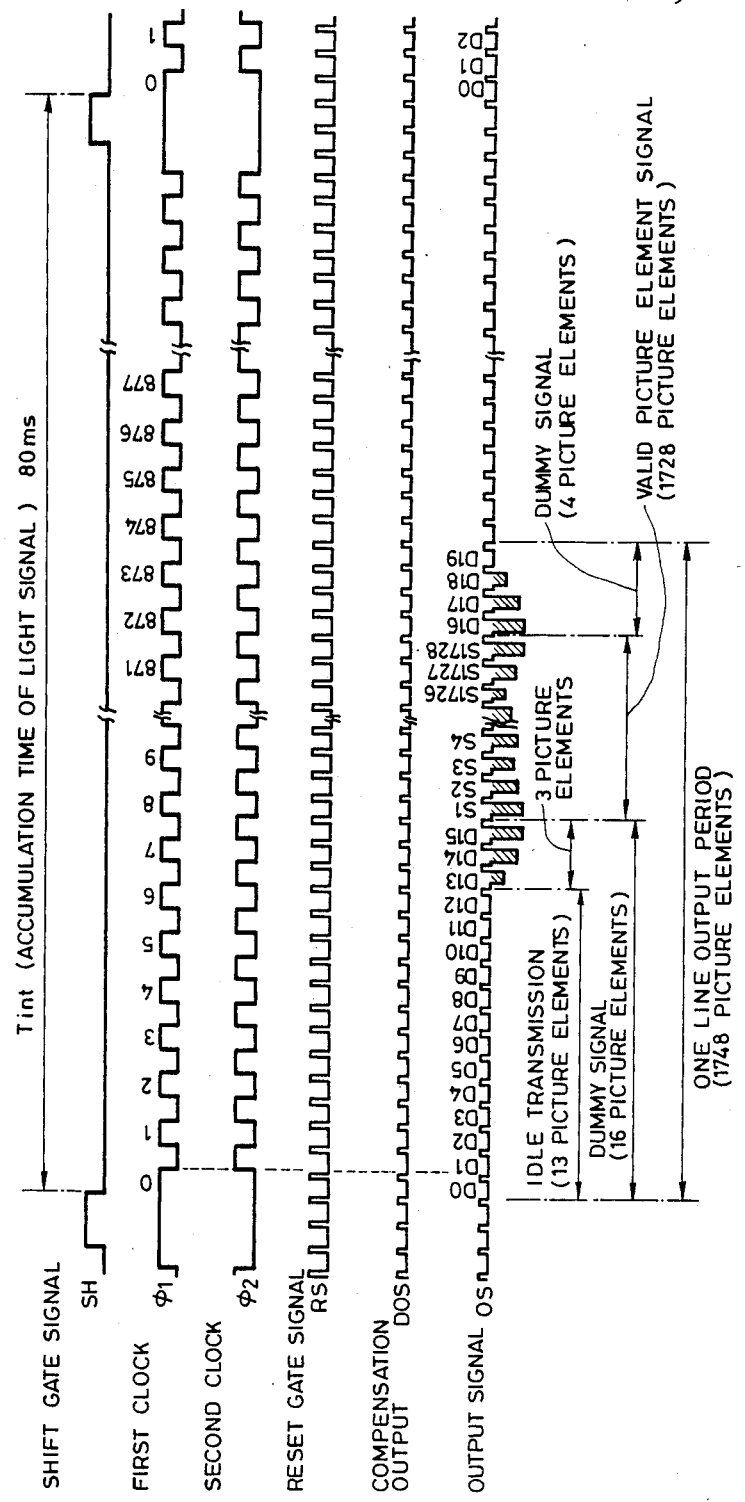

As a result of the phase-synchronization between the rotation of the rotary member 101 and the operation of the light source 102, the original 103 is sequentially illuminated by the light from the fluorescent material E (blue light), light from the fluorescent material B (green light) and the light from the fluorescent material D (red light), as shown in FIG. 12. The line sensor 117 then accumulates the respective light signals from the original 113 for the respective accumulation periods and then outputs blue color component signals, green color component signals and red color component signals corresponding to the blue, green and red components of the image, as shown in FIG. 16B.

Simultaneously with the commencement of the reading operation, the transfer motor is started to supply the transfer recording medium 118 from the supply roll 119 to the recording unit 120 in which light and heat are applied in accordance with the image signals to the transfer recording layer 118b of the transfer recording medium 118, whereby an image is formed on the transfer recording layer 118b.

More specifically, the transfer recording layer 118b has such a characteristic that its softening temperature rises, i.e., the transfer characteristic is irreversibly changed, under application of a light of a predetermined wavelength and heat, so that it becomes unable to transfer the image. The recording of image components of the respective colors is therefore conducted in a manner which will be explained hereinunder with reference to a timing chart shown in FIG. 12.

For recording the image component of magenta color, the heat generating elements amongst the heat generating elements 120b corresponding to the signals of the complementary color of magenta, i.e., signals of green color, are supplied with electric power for 25 ms. At the same time, the light source 102 is made to light up for 30 ms. In this state, the fluorescent material A on the rotary member 101 faces the portion of the transfer recording layer 118b opposing to the slit 104b so that the light energy of the spectral distribution as shown by curve A in FIG. 9 is uniformly applied to the transfer recording layer 118b.

The recording of the image component of cyan color is conducted, at a moment which is 80 ms after the commencement of the power to the heat generating elements in the recording of magenta image component, by allowing the heat generating elements amongst the elements 120b corresponding to the image signals of the complementary color of cyan, i.e., red, to be energized for 20 ms, simultaneously with lighting of the light source 102 for 30 ms. In this state, the fluorescent material C on the rotary member 101 opposes the portion of the transfer recording layer 118b facing the slit 104b so that light energy of the spectral distribution as shown by graph C in FIG. 9 is uniformly applied to the transfer recording layer 118b.

The recording of the image component of yellow color is conducted, at a moment which is 80 ms after the commencement of the power to the heat generating elements in the recording of cyan image component, by allowing the heat generating elements amongst the elements 120b corresponding to the image signals of the complementary color of yellow, i.e., blue, to be energized for 15 ms, simultaneously with lighting of the light source 102 for 30 ms. In this state, the fluorescent material E on the rotary member 101 opposes the portion of the transfer recording layer 118b facing the slit 104b so that light energy of the spectral distribution as shown by graph E in FIG. 9 is uniformly applied to the transfer recording layer 118b.

As has been described, the selective generation of heat in the heat generating elements on the recording head 120a rotation of the rotary member 101 and the lighting of the light source 102 are controlled in accordance with the image signals of the complementary colors of the respective colors magenta, cyan and yellow, so that a transferable image is formed on the transfer recording layer 118b. Meanwhile, the transfer recording medium 118 is fed in synchronism with the image formation at a period of 240 ms/line.

Figure 15:
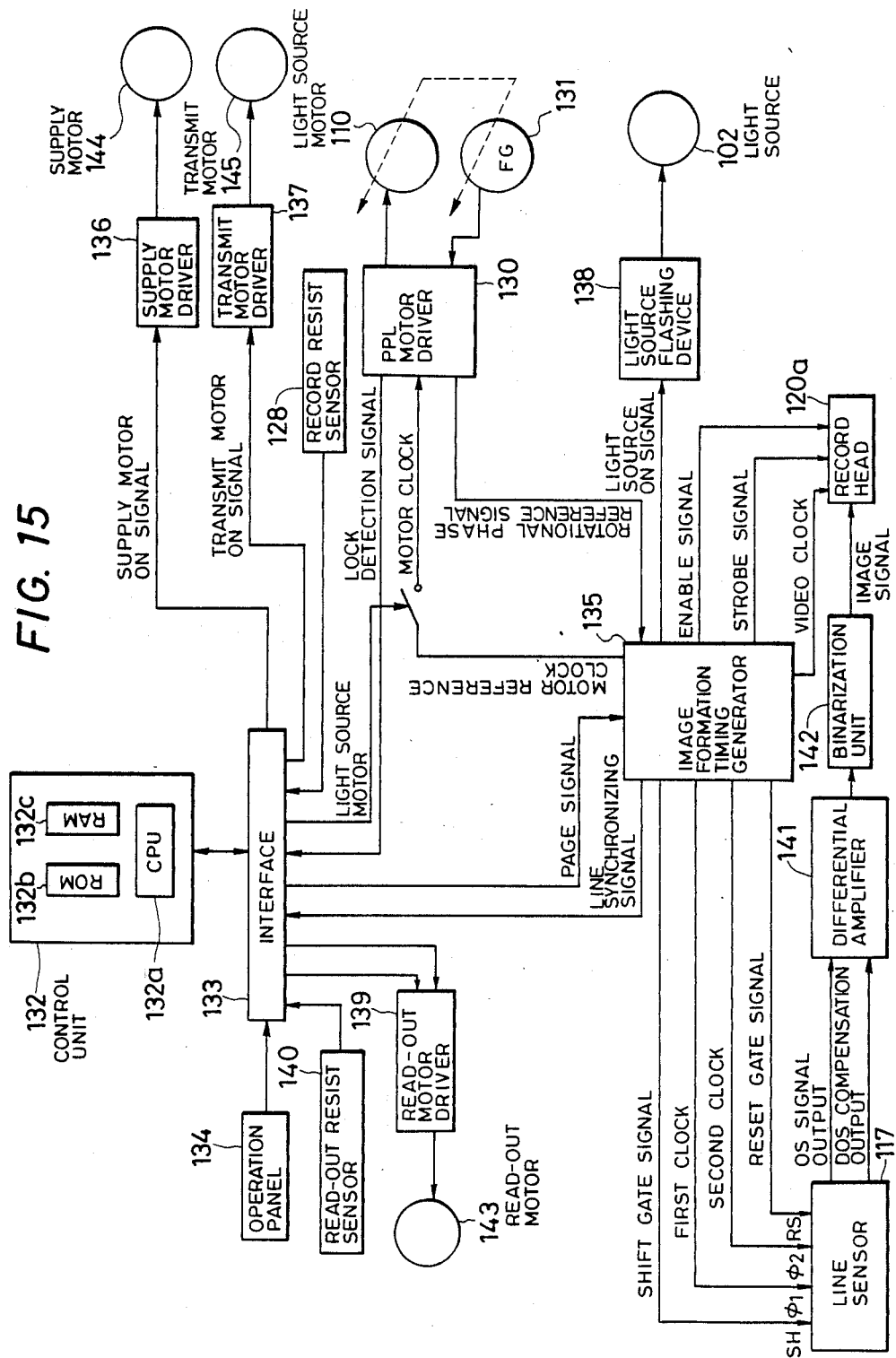
FIG. 15 is a block diagram of a control system.
Figure 17:
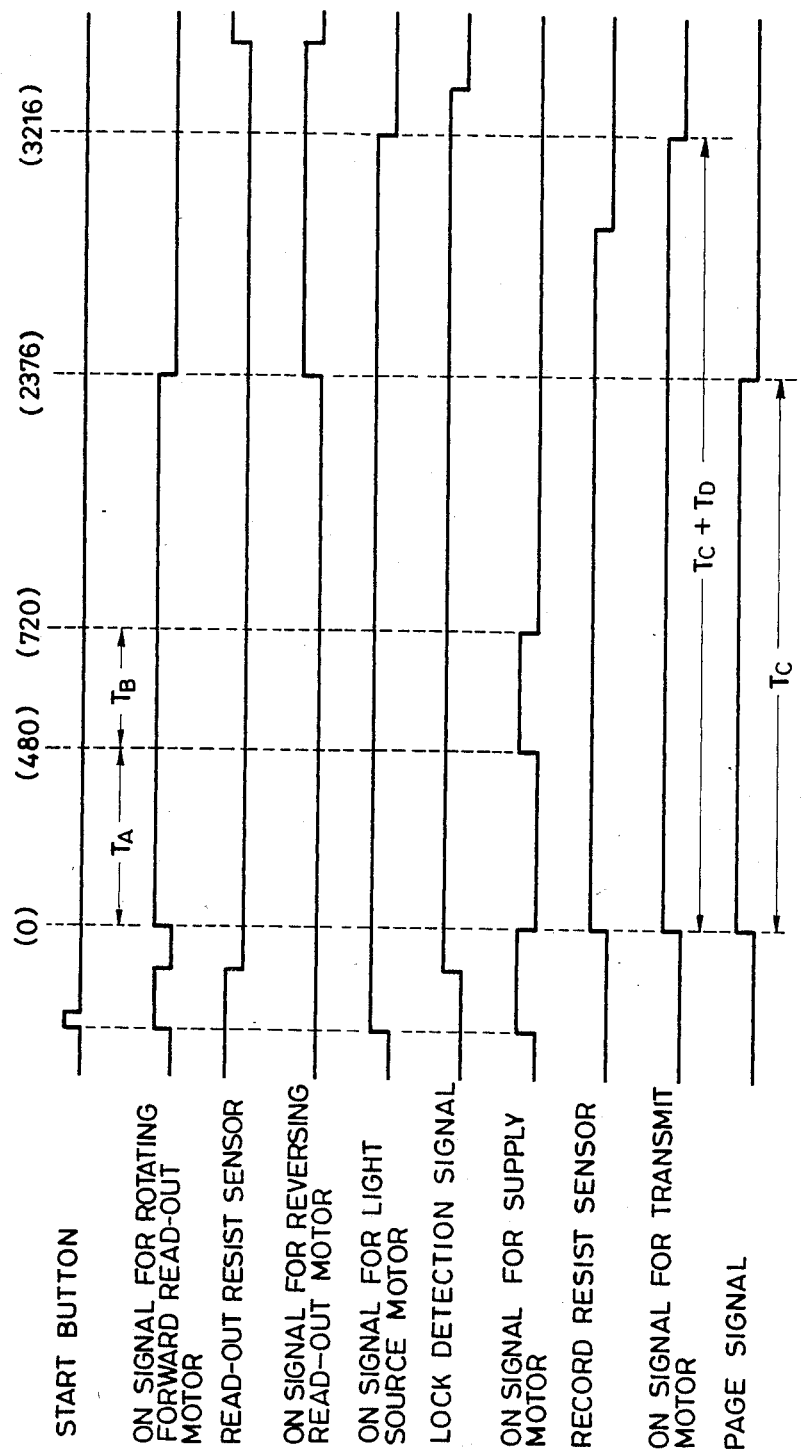
Figure 18:
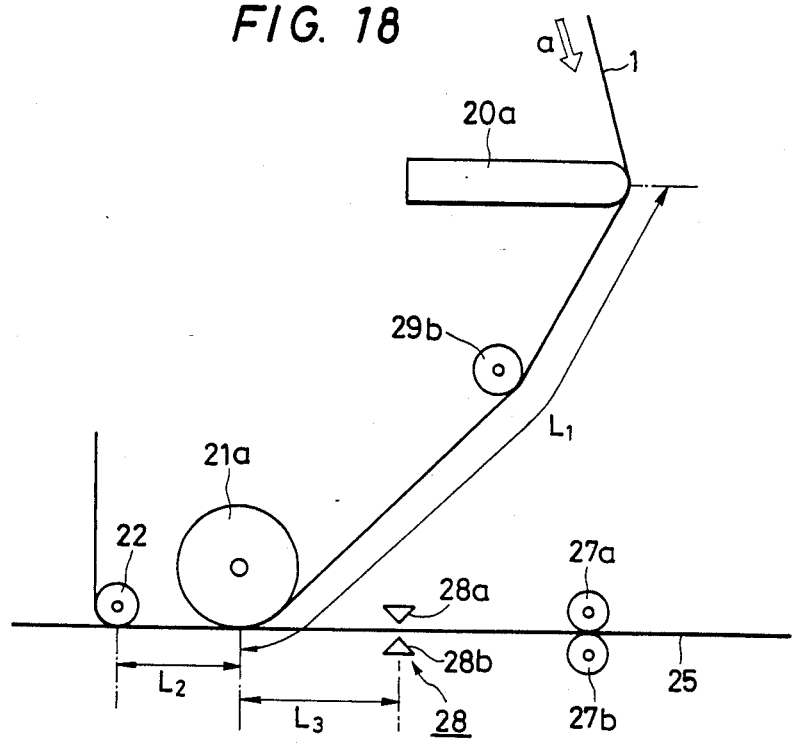
FIG. 18 is an illustration showing the relationships between the members.
Figure 21:
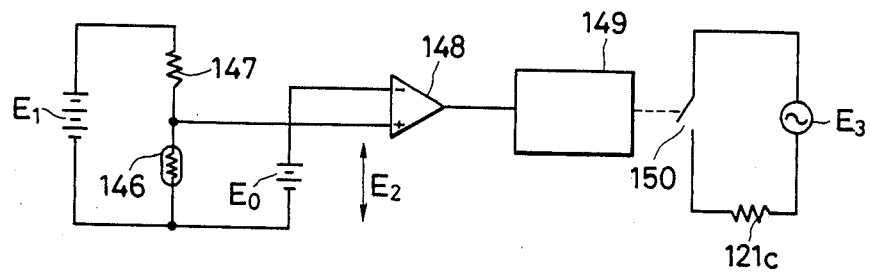
FIG. 21 is a circuit diagram of a system for controlling the temperature of a transfer roller.

A description will be made hereinunder as to a control system which controls the above-described operation, with specific reference to FIGS. 15 to 21. FIG. 15 is a block diagram of the control system, while FIGS. 16A, 16B and 17 are timing charts illustrating the recording operation. FIG. 18 is an illustration of relationships between operational members and FIG. 19 is a sequence table showing the sequence of delivery of various signals. FIG. 20 is a flow chart illustrating the recording operation. FIG. 21 is a circuit diagram of a system for controlling the temperature of the transfer roller 104a.

As will be seen from FIG. 15, the control system includes the following components: a control unit 132 including CPU 132a such as a microprocessor, a ROM 132b which stores the programs of controls to be performed by the CPU 132a, as well as other data, and a RAM 132c which serves as a working area for the CPU 132a and temporary stores various data; an interface 133; a control panel 134; an image formation timing generator 135; a feed motor driver 136; a conveyor motor driver 137; a recording register sensor 128; a PLL motor driver 130; a light source driver 138; a reading motor driver 139; a reading register sensor 140; a line sensor 117; a differential amplifier 141 and a binary coding device 142.

The control unit 132 receives, through the interface 133, various signals which includes informations input from the control panel 134, e.g., recording density, number of records, size of the recording medium, etc., signals from the recording and reading register sensors 128, 140, line synchronization signal produced by the image formation timing generator 135, and a lock signal from the PLL motor driver 130. The control unit 132 also delivers, through the interface 133, various signals including forward rotation and backward rotation driving signals for the reading motor 143, driving signal for the feeding motor 144, driving signal for the conveyor motor 145, a page signal and a driving signal for the light source motor.

The image formation timing generator 135 has an internal quartz oscillator and has a function for demultiplying the output frequency of the oscillator so as to form various signals including a line synchronizing signal, page synchronizing signal, video clock, enable signal, strobe signal, light-source on signal, shift gate signal, first and second clocks, reset gate signal and motor reference clock.

As shown in FIG. 16A, the line synchronizing signal is a signal having a period of 240 ms and formed in accordance with a rotation phase reference signal derived from the PLL motor driver 130. The page signal delivered from the control unit 132 through the interface 133 is latched at the timing of the rising edge of the line synchronizing signal, whereby a page synchronizing signal is formed.

The video clock is a signal which includes repetitive clocks starting at the moment of rise of the line synchronizing signal and repeated at a period of 80 ms with a frequency of 25 KHz. After generation of 1744 clocks (corresponds to about 70 ms), this video clock is suspended. As will be seen from FIG. 16B, the line sensor of this embodiment has initial 16 pixels corresponding to a dummy signal. The recording head 120a has 1728 pixels per line.

The image formation timing generator 135 produces a strobe signal at a period of 80 ms. The strobe signal takes "High" level throughout the period in which the video clock is suspended.

The enable signal starts up at a moment which is 80 ms from the first line synchronizing signal after setting of the page synchronizing signal at "High" level. The enable signal includes durations of "high" for 25 ms, 20 ms and 15 ms in each period of 80 ms. The enable signal ceases at the moment of generation of the "High" level of 15 ms in the "High" period of the first line synchronizing signal after setting of the page synchronizing signal at "Low" level. This enable signal corresponds to the signals for supplying electric power to the heat generating elements corresponding to the image signals as shown in FIG. 12.

The image formation timing generator 135 also generates a light-source ON signal. The light-source ON signal starts up at the moment of the rise of the first line synchronizing signal after setting of the page synchronizing signal at "High" level. The light source ON signal includes repetition of "High" level of 30 ms in each period of 80 ms, and ceases at the moment of the first "High" period of 30 ms after the edge of the fall of the page synchronizing signal.

The image formation timing generator 135 also produces a motor reference clock which is used as a reference for the formation of the motor clock to be delivered to the PLL motor driver 130. This clock is a continuous clock of 6 kHz. The above-mentioned motor clock is delivered to the PLL motor driver 130 through a switch which is controlled by the light-source ON signal delivered by the control unit 132 through the interface 133.

The image formation timing generator 135 further generates signals for driving the line sensor 117, i.e., the shift gate signal, first and second clocks and the reset gate signal as shown in FIG. 16B. The timing of fall of the shift gate signal coincides with the timing of the edge of the rise of the line synchronizing signal. The shift gate signal has a period of 80 ms and includes repetitive pulses each having a duration or width of 1 ms. The first clock is a signal which takes "High" level when the shift gate signal is set "High", whereas, when the shift gate signal is "Low", the first clock is a pulse signal of 12.5 kHz and having a duty ratio of 50%. The second clock is a signal which is obtained by inverting the first clock. The reset gate signal is continuous clocks having a frequency of 25 kHz and a duty ratio of 25%. The fall of the reset gate signal is synchronous with the edge of fall of the first clock.

The operation of the original reading portion R is as follows. When the reading motor forward rotation driving signal delivered by the control unit 132 through the interface 133 is "High", the reading motor driver 139 drives the reading motor 143 forwardly so as to cause the original table 111 to slide in the direction of the arrow C in FIG. 7C at a speed of 0.521 mm/s. Conversely, when the reading motor backward rotation driving signal from the control unit 132 is "High", the reading motor is reversed to cause the original plate 111 to slide in the direction counter to the arrow C at a speed of 50 mm/s.

The line sensor 117 in the illustrated embodiment is a CCD linear image sensor, which is Model TCD101AC produced by Toshiba Corp. The line sensor 117 operates upon receipt of the shift gate signal, first and second clocks and the reset gate signal from the image formation timing generator 135, such as to photo-electrically convert the light image signals received in a light signal integration period (Tint) between a fall of a shift gate signal and the next fall of the same and integrates the converted signals, as shown in FIG. 16B. The thus integrated image signals are output from a signal output terminal in the next integration period Tint in synchronization with the first and second clocks. The difference between the output signal and a compensation output is amplified by a differential amplifier 141 the output of which is binary-coded by the binary-coding device 142 so as to be changed into image signals.

The recording head 120a picks up the image signals into a shift register in the recording head 120a in accordance with the video clock from the image formation timing generator 135. The thus picked up image signals are latched in a latch register in the head 120a, in accordance with the strobe signal from the image formation timing generator 135. Thereafter, the supply of the electric power to the heat generating elements 120b is conducted in accordance with the image signals in the latch register, upon receipt of the enable signal from the image formation timing generator 135. Simultaneously with the supply of the electric power to the heat generating elements 120b, the next batch of image signals is picked up by the shift register in accordance with the video clock.

The driver 138 for the light source 102 operates in accordance with the light-source ON signal from the image formation timing generator 135 such as to turn the light source on throughout the period of "High" state of the light-source ON signal.

The PLL motor driver 130 drives the light source motor 110 in such a manner that synchronization is obtained between the input motor clock and the output (see FIG. 13A) from the light-receiving member 101c, as shown in FIG. 14. The PLL motor driver 130 delivers, through the interface 133, a lock detection signal so as to inform the control unit 132 of the phase synchronization between the input motor clock and the output (see FIG. 13A) from the light-receiving member 101c, and also delivers a rotation phase reference signal to the image formation timing generator 135 for the purpose of attaining synchronism between the rotation of the rotary member 101 and the line synchronizing signal. There are 1440 pieces of light shielding portions 101a, 101a' on the rotary member 101. If the operation of the light-source motor 110 is synchronized by the PLL motor driver 130, the rotary member 101 rotates at period of 240 ms/rotation because the frequency of the motor clock is 6 kHz as explained before.

A description will be made hereinunder as to the flow of image signals from the image reading portion R to the image recording portion W.

Referring to FIG. 16A, in a period $T_0$ in which the fluorescent material D faces the slit 104a, the original 113 is illuminated by the light from the fluorescent material D, i.e., by light of red color, so that the red signals corresponding to the red component of the image of the original 113 are stored in the line sensor 117. In the next period $T_1$, the red signals are output in synchronization with the first and second clocks and are processed through the differential amplifier 141 and the binary-coding device 142, whereby the processed red signals are picked up by the shift register in the recording head 120a. The color of the this picked up image signals, i.e., red, is the complementary color of cyan, so that these signals serve as cyan image signals in the actual recording process. These signals are then latched by the latch register in the recording head 120a. In the next period $T_2$ in which the fluorescent material C faces the slit 104b, the heat generating elements 120b are selectively energized in accordance with the latched image signals in response to an enable signal of 20 ms width. At the same time, the transfer recording layer 118b is illuminated by the light from the fluorescent material C. In consequence, the light energy of wavelength characteristic peculiar to the fluorescent material C and the heat energy generated by the selected heat generating elements are applied to the transfer recording medium 118 so that the transfer characteristic of the cores of the composition shown in Table 4 is changed to allow recording of image component in cyan color.

Similarly, the blue signals corresponding to the blue component of the image on the original 113 is stored in the period $T_1$ in which the fluorescent material E faces the slit 104a and, in a period $T_3$ at which the fluorescent material E faces the slit 104b, the image component is recorded in yellow color. Similarly, the green signals corresponding to the green component of the image on the original 113 is stored in the period $T_2$ in which the fluorescent material B faces the slit 104a and, in a period $T_4$ at which the fluorescent material A faces the slit 104b, the image component is recorded in magenta color. This operation is conducted repeatedly so that image is formed on the transfer recording layer 118b simultaneously with the reading of the image on the original 113.

Thus, in the described embodiment, the fluorescent materials A, C, E for recording purpose and the fluorescent materials B, D, E for the reading purpose are provided alternately on the inner surface of the rotary member 101. At the same time, the fluorescent material E for the reading purpose, which is the same as that E for the recording purpose, is provided adjacent to the fluorescent material E for the recording purpose. The sequence of the reading fluorescent materials B, D and E are so determined as to coincide with the sequence of complementary colors of the color tones exhibited by the image forming elements correspondingly to the lights from the recording fluorescent materials A, C, E. With this sequence of the fluorescent materials, the rotary member 101 rotates in the direction of an arrow d in FIG. 7B. In consequence, the reading portion R and the recording portion W are illuminated simultaneously, with the relationships established between the slits 104a, 104b and the fluorescent materials as shown in FIG. 16A. Namely, illumination in the reading portion R with red light and the recording in the recording portion W with yellow color are conducted simultaneously. Similarly, illumination in the reading portion R with blue light and the recording in the recording portion W with magenta color are conducted simultaneously. Likewise, illumination in the reading portion R with green light and the recording in the recording portion W with cyan color are conducted simultaneously.

In this embodiment, the CCD shift register in the line sensor 117 and the shift register in the recording head 120a constitute means for attaining synchronization between the operation in the reading portion and the operation in the recording portion.

It will be understood that the described arrangement simplifies the construction of the rotary member 101 and makes it possible to standardize the timings of processing of various image signals, thus allowing the construction of the processing circuit to be simplified.

A description will be made hereinunder as to the control for the feed and convey of the transfer recording medium 118 and the recording paper 125, necessary for the transfer of the image from the transfer recording layer 118b of the transfer recording medium 118 to the recording paper 125.

The feed motor driver 136 operates to drive the feed motor 144 when the level of the feed motor driving signal delivered by the control unit 132 through the interface 133 is "High", so that the feed roller 126 and the pair of register rollers 127a, 127b are rotated to feed the recording paper 125 at a constant speed.

On the other hand, the conveyor motor driver 137 drives the conveyor motor 145 when the conveyor motor driving signal delivered by the control unit 132 through the interface 133 is "High", thereby to drive the transfer roller 121a. As a result, the transfer recording medium 118 and the recording paper 125 are fed and conveyed at the same constant speed by the cooperation between the transfer roller 121a and the pressing roller 121b which is driven through friction by the transfer roller 121a.

The timings of delivery of the above-mentioned signals from the control unit 132 through the interface 133 are shown in FIG. 17. The periods $T_A$ to $T_D$ in FIG. 17 are the lengths of time required for the transfer recording medium 18 or the recording paper 125 to travel distances $L_1$ to $L_3$ between members as shown in FIG. 18.

$L_1$: distance to be traveled by the transfer recording medium 118 from the recording head to the nip between the transfer roller 121a and the pressing roller 121b $L_2$: distance to be traveled by the transfer recording medium from the above mentioned nip to the separation roller 122

$L_3$ distance to be traveled by the recording paper 125 from the recording register sensor 128 to the above-mentioned nip $T_A$: length of time required for the transfer recording medium 118 to travel a distance $L_1$-$L_3$ $T_B$: length of time required for the recording paper 125 to travel the distance $L_3$ $T_C$: length of time required for the transfer recording medium 118 to travel a distance equal to the length of the recording paper 125 (297 mm in case of an A-4 size paper)

$T_D$: length of time required for the transfer recording medium to travel a distance $L_1+L_2$ Actual operation is as follows. When the operator presses a start button on the control panel 134, the feed motor 144 and the light-source motor 110 are started, while the reading motor 143 operates forwardly. The feed motor 144 feeds the recording paper 125 and stops to operate when the leading end of the recording paper 125 is sensed by the recording register sensor. Meanwhile, the reading motor 143 drives the original table 111 in the direction of the arrow C in FIG. 7C until it stops when the leading end of the original has been brought to the position for reading by the line sensor 117, i.e., when the output from the reading register sensor is set "Low". In this state, the phasesynchronization has been attained for the rotation of the rotary member 101 which is driven by the light-source motor 110. Subsequently, the reading motor 143 rotates forwardly and the conveyor motor 145 operates to convey the transfer recording medium 118 in the direction of the arrow a in FIG. 1. Then, the page signal is set "High" for a period $T_C$ so as to enable the recording unit 120 to form the transferable image.

The conveyor motor 145 stops after elapse of a time $T_D$ from the expiration of the above-mentioned image forming period $T_C$.

The feed motor 144 operates for a period $T_B$ after elapse of a time $T_A$ from the start of convey of the transfer recording medium 118, so as to feed the recording paper 125 at the same speed as the transfer recording medium 118 and then stops. In consequence, the leading end of the recording paper 125 is registered with the leading end of the transferable image formed on the transfer recording medium 118 within the transfer unit 121 and, thereafter, the recording paper 125 is conveyed by the power of the conveyor motor 145 while being held in close contact with the transfer recording medium 118.

The control unit 132 delivers various signals as shown in FIG. 17. The operation of this control unit 132 will be described hereinunder. The control unit 132 receives, through the interface 133, a series of line synchronizing signals and counts the number of the line synchronizing signals by means of a software counter. Since the line synchronizing signals has a repetition period of 240 ms as explained before, the control unit 132 can manage the time by counting the the line synchronizing signals.

The control unit 132 has a sequence table as shown in FIG. 19. After the setting of the recording register sensor signals and the reading register sensor signal at "High" and "Low", respectively, the control unit 132 sequentially outputs the feed motor driving signal, conveyor motor driving signal, reading motor forward rotation driving signal, reading motor backward rotation driving signal and the page signal, with reference to the sequence table in accordance with the count of the line synchronizing signal, thereby to control the operations of various parts of the apparatus.

In the described embodiment, the sequence table has a 3-bit type construction as shown in FIG. 19, and includes 3217 words from 0 to 3216. The bit "0" bears the feed motor driving signal, the bit "1" bears the conveyor motor driving signal, and the bit "2" bears the page signals and the reading motor forward rotation driving signal.

The page signal and the reading motor forward rotation driving signal are set "Low" and the reading motor backward rotation driving signal is set "High" from the moment at which the level of the signal in the bit "2" is changed to 0. Thereafter, the control unit 132 detects the reading register sensor signal from the conveyor motor control by making reference to the sequence table shown in FIG. 19 and sets the reading motor backward rotation driving signal "Low" when the level of the signal from the reading register sensor is changed to "High".

Numerals appearing in ( ) at the upper part of FIG. 17 shows the serial No. of the line synchronizing signal (number of the signals) at the respective moments, with the serial No. 0 (zero) set on the line synchronizing signal obtained when the recording register sensor signal is set "High".

A description will be made hereinunder as to the series of operation of the control unit 132 having the described functions, with reference to a flow chart shown in FIG. 20.

In Step S 1, a judgment is conducted as to whether or not the start button on the control panel 134 is pressed. If the start button has been pressed, the process proceeds to Step S 2 in which the control unit issues the feed motor driving signal, reading motor forward rotation driving signal and signal for driving the light source motor. Then, as the recording register sensor signal is set "High" in Step S 3, the feed motor 145 is made to stop in Step S 4. If the level of the reading register sensor signal is "Low", (S 5), the reading motor 143 is made to stop in Step S 6. Then, the process is suspended until the signal from the recording register sensor 128 and the signal from the reading register sensor are changed to "High" and "Low", respectively (S 7).

Subsequently, upon confirming the changing of the lock detection signal from the PLL motor driver 130 to "High", i.e., after the synchronization of rotation of the rotary member 1 is obtained (S 8), 0 (zero) is substituted for "R" which represents the raster No. of the sequence table.

The control unit then wait for the line synchronizing to be switched to "Low" in Step S 10 and then waits for the same to be switched to "High" in Step S 11, thus detecting the edge of the rise of the line synchronizing signal. Upon detection of the edge, the control unit refers to the raster R in the sequence table so as to detect the value in the bit "0" in Step S 12, and delivers this value as the feed motor driving signal. Namely, the feed motor 144 is started when the value in the bit "0" is [1], whereas, when the value in the bit "0" is [0], the feed motor 144 does not operate (S 13 and S 14). Then, the value in the bit "1" is detected in Step S 15, and the detected value is output as the conveyor motor driving signal. Namely, the conveyor motor 145 is started when the value in the bit "1" is [1], whereas, when the value in the bit "1" is [0], the conveyor motor 145 does not operate (S 16 and S 17). Then, the value in the bit "2" is detected in Step S 18. The page signal is set "High" and the reading motor 143 is driven forwardly when the value in the bit "2" is [1]. When the value in the bit "2" is [0], page signal is set "Low" and the reading motor 143 is driven backward only when the reading register sensor output is "Low". Thus, the reading motor 143 is made to suspend its operation when the signal from the reading register sensor 140 is "High". These operations are conducted in Steps S 20 to S 23. Subsequently, 1 is added to the value of the R in Step S 24, and a judgment is conducted in Step S 25 as to whether the value of R exceeds 3216. If the value of R is not greater than 3216, the process returns to Step S 10 so as to continue the recording operation. Conversely, if 3216 is exceeded, the light-source motor 110 is made to stop in Step S 26. Then, the output of the reading register sensor is detected and, if the level of this signal is "Low", the control unit waits for the signal to be turned to "High" and, thereafter, stops the reading motor thereby completing the recording operation (Steps S 27 and S 28).

The image thus formed is transferred by heating in the transfer unit 121 onto the recording paper 125. The heat is delivered from the transfer roller 121a the temperature of the surface thereof is controlled by a system which will be described hereinunder with reference to FIG. 21.

Referring to FIG. 21, a thermistor 146 is disposed in contact with the surface of the transfer roller 121a so that its resistance value is varied in accordance with the temperature of the surface of the transfer roller 121. This resistance value is converted into a voltage $E_2$ by a power supply $E_1$ and a resistor 147, and the voltage $E_2$ is compared with a reference voltage by means of a comparator 48. The comparison output is delivered through a relay driver 149 to a relay 150 which controls the supply of electric power from the power supply $E_3$ to the halogen heater 121c.

The principle of operation of the temperature control system shown in FIG. 21 is as follows. As is well known, a thermistor 146 has a tendency to reduce its resistance value in accordance with a rise in the temperature. Thus, the resistance value of the thermistor 146 is reduced as the temperature of the surface of the transfer roller 121a rises, so that the voltage $E_2$ is lowered correspondingly. Conversely, a reduction in the temperature of the surface of the transfer roller 121a causes the resistance value of the thermistor 146 to increase, with the result that the voltage $E_2$ is raised correspondingly. The value of the reference voltage $E_o$ is set at a level which corresponds to the desired temperature of the surface of the transfer roller 121a, e.g., 95° C. When the surface temperature of the transfer roller 121a is below 95° C., therefore, the comparison output takes "High" level so that the electric power is supplied to the halogen heater 121c thereby to increase the temperature at the surface of the transfer roller 121a. Conversely, when the temperature of the surface of the transfer roller 121a is higher than 95° C., electric power is not supplied to the halogen heater 121c so that the surface temperature comes down. In consequence, the surface temperature of the transfer roller 121a is maintained to fall within the range between 90° and 100° C. This temperature control system is operative insofar as the power supply switch of the system is on so that the temperature between 90° and 100° C. is established on the surface of the transfer roller 121a before the start button is pressed.

Through the series of operation described hereinbefore, the image formed on the transfer recording layer 118b is transferred in the transfer unit 121 onto the recording paper 125 and recorded on the latter as a color image composed of magenta, cyan and yellow color components.

Subsequently, the transfer recording medium 118 and the recording paper 125 are separated from each other by means of the separation roller 122, and the recording paper 125 now carrying the image of desired colors recorded thereon is discharged into a discharge tray 152 by means of a pair of discharge rollers 151a, 151b.

Next, another examples of each section will be described below.

(1) Transfer recording medium

In the above-described embodiments, the image is transferred on the sheet 125 of recording paper by a change in the softening point of the transfer recording layer 118b made of a polymer with a coloring agent contained therein, the change being caused by application of energy in the form of both heat and light. However, transfer of the image may also be performed by a change in the adhesive or sublimate characteristics of the transfer layer. Alternatively, the sheets 125 of recording paper may be provided with coloring characteristics, and a layer for changing the coloring characteristics of the sheets 125 of recording paper may be provided on the transfer medium 118 so as to allow the image formed on the transfer medium 118 to be transferred on the sheet 125 of recording paper.

In these embodiments, the carrier 118a of the transfer medium 118 is made of polyethylene terephtalate. However, it may also be formed of a polyamide, a polyimide, a capacitor tissue, or a sheet of cellophane.

Any type of transfer layer 118b may be used, if the transfer layer 118b is of a type whose property is caused to change by application of a plurality of types of energy so as to allow the images to be formed thereon. Suitable types of transfer layer 1b include those whose melting temperature, softening point, glass transition point, or viscosity changes by the application of the plurality of types of energy.

Each of the image forming element assemblies forming the transfer layer 118b contains a sensitive component and a coloring component. It is desirable to employ a sensitive component whose property begins to change or whose rate of reaction for causing change in its property changes suddenly by the application of a plurality of types of energy.

A polymerizable component may be used as a sensitive component, and suitable polymerizable components include monomers, oligomers and polymers which can cause polyreaction or crosslinking reaction.

The suitable monomers or oligomers include polyvinyl cinnamate, p-methoxycinnamic acid, a half ester of succinic acid, and those whose end or side chain has a reactive group, such as epoxy resins or unsaturated polyester resins.

The suitable polymerizable monomers include ethylene glycol diacrylate, and propylene glycol diacrylate.

If any of the polymerizable monomers or oligomers is used, cellulose acetate succinate or methyl methacrylate-hydroxyethyl methacrylate copolymer may be contained in order to improve ability of forming the layer.

In order to cause reaction of the polymerizable component, a reaction initiator is added, if necessary. Suitable reaction initiators include radical reaction initiators such as azo compounds, organic sulfur compounds, carbonyl compounds, or halogen compounds.

In particular, suitable reaction initiators that can be employed to form a transfer layer which allows the images to be formed by the application of energy in the form of both heat and light include those which ensure that the rate of reaction of the polymerizable component with the reaction initiator which acts on receipt of the light energy is largely affected by the temperature, when used with any of the polymerizable components.

Such combinations of polymerizable component and reaction initiator include a combination of any polymerizable prepolymer having functional groups, such as a copolymer of ester methacrlate or acrylic ester, any light-sensitive crosslinking agent, such as tetraethylene glycol diacrylate, and any reaction initiator, such as benzophenone, or mikerase ketone.

A coloring agent is a component contained for forming an optically recognizable image. Any of various types of pigment or dyes is used as a coloring agent. Such pigments or dyes include an inorganic pigment such as carbon black or lead yellow, an organic pigment such as Victoria Blue lakes or fast sky blue, a leuco dye, and a phthalocyanine dye.

Any of stabilizing agents, such as hydroquinone, or p-methoxyphenol, may be contained in the transfer layer 118b.

Any of sensitizers, such as p-nitroaniline or 1, 2-benzanthraquinone, may be contained in the transfer layer in order to improve the activation of the reaction initiator with respect to the energy applied.

In addition to the coloring agent and sensitive component, the transfer layer 118b may contain a binder which may be a resin, a wax, or a liquid crystal.

Suitable resins that can be used as a binder include polyester or polyamide resins. At least one of these resins may be used as a binder.

Suitable waxes that can be used as a binder include a vegetable wax, such as canelilla wax or carnauba wax, an animal wax, such as whale wax, a mineral wax, such as montan wax, and a synthetic wax, such as fatty acid, fatty amide, or ester. At least one of these waxes may be used as a binder.

Suitable liquid crystals that can be used as a binder include cholesterol hexanoate and cholesterol decanoate.

If the image forming elements which form the transfer layer 108b are in a micro-capsular form, the cores are made of the materials described above, and the walls of the micro-capsules are made of gelatin and gum arabic, a cellulose, such as nitro cellulose or ethyl cellulose, or a polymer, such as polyethylene or polystyrene.

(2) Recording portion

In the above-described embodiment, light beams having predetermined wavelengths which are capable of generating desired colors are illuminated on the transfer recording medium 118 from the side of the transfer layer 118b, and heat is applied in accordance with the image signals to the transfer recording medium from the side of the carrier 118a. However, heat may be applied uniformaly while the predetermined types of lights are modulated in accordance with the image signals.

If the carrier 118a is made of a transparent material, irradiation by light may be performed on the side of the carrier 118a, and application of heat may be conducted on the side of the transfer recording layer 118b.

In the embodiment described above, light illumination and heat application are performed on the two sides of the carrier 118a. However, they may be conducted on the one side thereof for forming images.

A combination of a yttrium alminium garnet laser and a polygon mirror may be used as a heating means in place of the recording head 120a for selectively heating the heating elements.

A light emitting diode array or a combination of Xenon lamp and a filter which assures the light absorption characteristics of the material employed may be used as a light illuminating means in place of the described fluorescent lamp of the light source 102.

In the embodiment described above, light energy and heat energy are applied to the transfer layer 118b at one time. However, both types of energy may be applied at different times, provided that both types of energy produce the expected result.

(3) Transfer portion

The structure of the transfer section is not limited to roller-shaped components such as the transfer roller 121a and the pressing roller 121b, but the transfer section may be any of those which ensures a predetermined pressure therebetween, such as rotary belts.

It is also possible to provide fixing means downstream from the separation roller 122 as viewed in the direction of the recording member, for the purpose of fixing the image which has been transferred onto the surface of the recording member in the transfer portion of the apparatus.

(4) Recording member

Although a sheet of recording paper has been specifically mentioned, this is only illustrative and various other types of recording members can be used equally well, e.g., a plastic transparent sheet for overhead projectors.

The images which can be read and/or recorded by the apparatus of the described embodiment includes various types of images such as letters, numerals, patterns, photographs and so forth.

As has been described, according to the present invention, a rotary member carrying sat least two types of fluorescent materials are rotated at a constant speed and object or objects are illuminated by the light successively emitted from the successive fluorescent materials. It is therefore possible to illuminate a restricted area on object or objects with lights of different spectral characteristics while the lights are switched at high speed. In a preferred form of the invention, fluorescent materials for emitting lights for reading an image and fluorescent materials for emitting lights for recording the image are provided on the rotary member so that the reading of an original image and recording of the same can be effected simultaneously. The number of types of the fluorescent materials can be reduced by arranging such that a fluorescent material is used commonly both for the reading and recording of the image.

The illuminating apparatus of the present invention can suitably be employed in a recording apparatus, so as to serve both as an illuminating light source and a source of light energy for recording the image. Such a recording apparatus considerably saves the space and reduces the production cost, while performing high-speed reading and recording of an image.

Thus, the present invention provides an illuminating apparatus which is capable of illuminating object or objects with a plurality of lights of different spectral characteristics with a high degree of reliability and at a high speed of switching between the successive lights, as well as a recording apparatus making use of such an illuminating apparatus.

We claim:

1. An illuminating apparatus for illuminating object with lights comprising:
   a rotary member having four types of fluorescent materials, two of which are for emitting lights which are used for recording while the remaining two are for emitting lights which are used for reading;
   driving means for driving said rotary member;
   lighting means for causing said fluorescent materials to emit lights; and
   a plurality of light paths for guiding said light from said fluorescent materials to a plurality of objects.

2. An illuminating apparatus according to claim 1, wherein said fluorescent materials are applied to the surface of said rotary member such that vacant regions without any fluorescent material is formed between adjacent regions of fluorescent materials.

3. An illuminating apparatus according to claim 1, wherein said rotary member has four types of fluorescent materials which are applied to the surface of said rotary member such that the region of each fluorescent material has a circumferential length corresponding about 90°, with a vacant region having no fluorescent material left between each adjacent regions.

4. An illumination apparatus according to claim 1, wherein said rotary member has diametrically opposing fluorescent materials which emit lights to be used in recording and diametrically opposing fluorescent materials which emit lights to be used in reading.

5. An illuminating apparatus according to claim 1, wherein one of said fluorescent materials is $Ca(PO_4):Tl$.

6. An illuminating apparatus according to claim 1, wherein one of said fluorescent materials is $SrMgP_2O_7:Eu^{2+}$.

7. An illuminating apparatus according to claim 1, wherein one of said fluorescent materials is $ClMgAl_{10}O_{19}:Tb^{3+}$.

8. An illuminating apparatus according to claim 1, wherein one of said fluorescent materials is $BaMg_2Al_{16}O_{27}:Eu^{2+}$.

9. A recording apparatus capable of reading an image information and recording an image on a recording member in accordance with the read image information, comprising:
   a rotary member having a plurality of types of fluorescent materials;
   driving means for driving said rotary member;
   lighting means for causing said fluorescent materials to emit lights;
   image reading means capable of reading an image by means of an illuminating light;
   image forming means capable of forming an image on said recording member by means of an illuminating light;
   a first illuminating light path through which the light emitted from one of said fluorescent materials is guided to said image reading means; and
   a second illuminating light path through which the light emitted from one of said fluorescent materials is guided to said image forming means.

10. A recording apparatus according to claim 9, wherein said fluorescent materials are applied to the surface of said rotary member such that vacant regions without any fluorescent material is formed between adjacent regions of fluorescent materials.

11. A recording apparatus according to claim 9, wherein said rotary member has four types of fluorescent materials which are applied to the surface of said rotary member such that the region of each fluorescent material has a circumferential length corresponding about to 90°, with a vacant region having no fluorescent material left between each adjacent regions.

12. A recording apparatus according to claim 9, wherein said rotary member has four types of fluorescent materials, two of which are for emitting lights which are used for recording, while the remainder two are intended for emitting lights which are used for reading.

13. A recording apparatus according to claim 9, wherein said rotary member has diametrically opposing fluorescent materials which emit lights to be used in the recording and diametrically opposing fluorescent materials which emit lights to be used in the reading.

14. A recording apparatus according to claim 9, wherein one of said fluorescent materials is $Ca(PO_4):Tl$.

15. A recording apparatus according to claim 9, one of said fluorescent materials is $SrMgP_2O_7:Eu^{2+}$.

16. A recording apparatus according to claim 9, wherein one of said fluorescent materials is $ClMgAl_{10}O_{19}:Tb^{3+}$.

17. A recording apparatus according to claim 9, wherein one of said fluorescent materials is $BaMg_2Al_{16}O_{27}:Eu^{2+}$.

18. An illuminating apparatus comprising:

a rotary member having at least two types of materials;

driving means for driving said rotary member;

lighting means for enabling said fluorescent materials emit lights; and a plurality of illuminating light paths for guiding the lights emitted from said fluorescent materials;

wherein at least one of said plurality of illuminating light paths is for guiding a light for reading an image, and at least one of the remainder illuminating light paths is for guiding a light for recording an image.

19. An illuminating apparatus according to claim 18, wherein said fluorescent materials include first fluorescent materials for emitting lights for reading an image and second fluorescent materials for emitting lights for recording an image, said first and second fluorescent materials including at least one common fluorescent materials.

20. An illuminating apparatus according to claim 19, wherein said common fluorescent materials are disposed adjacent to each other.

21. A recording apparatus comprising:

light illuminating means including a rotary member having a plurality of image reading fluorescent materials and a plurality of image recording fluorescent materials, driving means for driving said rotary member, and lighting means for enabling said fluorescent materials to emit lights;

image reading means for reading image information by illuminating an original image by a light emitted from one of said image reading fluorescent materials in said light illuminating means; and image recording means having a recording portion in which an image is formed on an image forming medium through illumination with at least the light from one of the image recording fluorescent materials in said light illuminating means, and a transfer portion in which said image on said image recording medium is transferred to a recording member.

22. A recording apparatus according to claim 21, wherein said image recording medium has a plurality of types of image forming elements capable of exhibiting different color tones, and wherein the sequence of arrangement of said image reading fluorescent materials and the sequence of arrangement of said image recording fluorescent materials are determined to coincide with each other so that the sequence of color tones of the original sequentially read by means of the lights from said image reading fluorescent materials coincides with the sequence of the complementary colors of the respective color tones exhibited by said image forming elements as said image forming elements are sequentially brought into reaction by the lights from said image recording fluorescent materials.

23. An image recording apparatus according to claim 21, wherein said image reading means and said image recording portion are simultaneously illuminated, and means are provided for attaining synchronization between the color image signals obtained by the light illuminating said image reading portion and the color image signals obtained by the light illuminating said recording portion.

* * * * *

UNITED STATES PATENT AND TRADEMARK OFFICE
CERTIFICATE OF CORRECTION

PATENT NO.   : 4,888,635
DATED        : December 19, 1989
INVENTOR(S)  : TOSHIAKI HARADA ET AL.

It is certified that error appears in the above-identified patent and that said Letters Patent is hereby corrected as shown below:

IN THE SHEETS OF DRAWINGS,
<u>SHEET 7 OF 18</u>

FIG. 8, "INFLARED" should read --INFRARED--.

<u>SHEET 11 OF 18</u>

FIG. 14, "WAVE SHAVING" should read --WAVE SHAPING--.

<u>COLUMN 1</u>

Line 16, "reads" should read --read-- and "records" should read --record.

<u>COLUMN 2</u>

Line 42, "illuminating" should read --the illuminating--.
    Line 46, "cross sectional" should read --cross-sectional--.
    Line 60, "light-receiving" should read --light-receiving member--.

<u>COLUMN 3</u>

Line 67, "Dare" should read --D are--.

<u>COLUMN 4</u>

Line 5, "A.B,C" should read --A,B,C--.
    Line 15, "light shielding" should read --light-shielding--.

UNITED STATES PATENT AND TRADEMARK OFFICE
CERTIFICATE OF CORRECTION

PATENT NO. : 4,888,635
DATED : December 19, 1989
INVENTOR(S) : TOSHIAKI HARADA ET AL.

It is certified that error appears in the above-identified patent and that said Letters Patent is hereby corrected as shown below:

COLUMN 5

Line 44, "18a, the" should read --18a. The--.

COLUMN 6

Line 25, "was" should read --were--.

COLUMN 8

Line 16, "are" should read --is--.
Line 20, "are" should read --is--.
Line 37, "characteristics" should read --characteristic--.

COLUMN 9

Line 30, "white" should read --while--.
Line 46, "Care" should read --C are--.
Line 55, "(europium" should read --(europium---.
Line 57, "fluorescent material c" should read --fluorescent material C--.

COLUMN 10

Line 3, "mm)." should read --nm),--.

COLUMN 11

Line 45, "take-up roller 123" should read --take-up roll 123--.
Line 61, "carrier 118a, the" should read --carrier 118a. The--.

UNITED STATES PATENT AND TRADEMARK OFFICE
CERTIFICATE OF CORRECTION

PATENT NO. : 4,888,635

DATED : December 19, 1989

INVENTOR(S) : TOSHIAKI HARADA ET AL.

It is certified that error appears in the above-identified patent and that said Letters Patent is hereby corrected as shown below:

COLUMN 12

Line 49, "was" should read --were--.

COLUMN 13

Line 8, "adhesive 18g" should read --adhesive 118g--.
Line 12, "adhesive 18f" should read --adhesive 18g--.
Line 20, "adhesive 18f" should read --adhesive 18g--.

COLUMN 14

Line 58, "are" should read --is--.
Line 62, "are" should read --is--.

COLUMN 15

Line 39, "FG(Frequence" should read --FG(Frequency--.
Line 46, "FIG. 131" should read --FG 131--.
Line 59, "signals" should read --signal--.

COLUMN 17

Line 18, "such" should be deleted.
Line 22, "temporary" should read --temporarily--.
Line 31, "includes informations" should read --include information--.

UNITED STATES PATENT AND TRADEMARK OFFICE
CERTIFICATE OF CORRECTION

PATENT NO. : 4,888,635
DATED : December 19, 1989
INVENTOR(S) : TOSHIAKI HARADA ET AL.

It is certified that error appears in the above-identified patent and that said Letters Patent is hereby corrected as shown below:

COLUMN 19

Line 46, "light shielding portions 101a," should read --light-shielding portions 101a,--.
 Line 66, "this" should be deleted.

COLUMN 20

Line 17, "is" should read --are--.
 Line 23, "is" should read --are--.

COLUMN 21

Line 4, "convey" should read --conveying--.
 Line 29, "ing medium 18" should read --ing medium 118--.
 Line 63, "phasesynchroniza-" should read --phase-synchroniza---.

COLUMN 22

Line 9, "convey" should read --conveying--.
 Line 26, "has" should read --have--.
 Line 28, "the" (second occurrence) should be deleted.
 Line 62, "shows" should read --show--.
 Line 68, "operation" should read --operations--.

COLUMN 23

Line 24, "wait" should read --waits--.
 Line 63, "transfer roller 121a the" should read --transfer roller 121a and the--.

UNITED STATES PATENT AND TRADEMARK OFFICE
CERTIFICATE OF CORRECTION

PATENT NO. : 4,888,635
DATED : December 19, 1989
INVENTOR(S) : TOSHIAKI HARADA ET AL.

It is certified that error appears in the above-identified patent and that said Letters Patent is hereby corrected as shown below:

COLUMN 24

Line 2, "transfer roller 121." should read --transfer roller 121a.--.
    Line 6, "comparator 48." should read --comparator 148.--.
    Line 40, "operation" should read --operations--.

COLUMN 25

Line 4, "polyethylene terephtalate." should read --polyethylene terephthalate.--.
    Line 11, "transfer layer 1b" should read --transfer layer 118b--.
    Line 53, "ester methacrlate" should read --ester methacrylate--.

COLUMN 26

Line 32, "uniformaly" should read --uniformly--.
    Line 42, "a yttrium alminium garnet laser" should read --an yttrium-aluminium-garnet laser--.

COLUMN 27

Line 7, "includes" should read --include--.
    Line 11, "sat" should read --at--.
    Line 12, "are" should read --is--.
    Line 42, "object" should read --objects--.
    Line 57, "is" should read --are--.
    Line 64, "about 90°," should read --about to 90°,--.
    Line 65, "regions." should read --region.--.

UNITED STATES PATENT AND TRADEMARK OFFICE
CERTIFICATE OF CORRECTION

PATENT NO. : 4,888,635

DATED : December 19, 1989

INVENTOR(S) : TOSHIAKI HARADA ET AL.

It is certified that error appears in the above-identified patent and that said Letters Patent is hereby corrected as shown below:

COLUMN 28

- Line 37, "is" should read --are--.
- Line 45, "regions." should read --region.--.
- Line 60, "one" should read --wherein one--.

COLUMN 29

- Line 5, "emit" should read --to emit--.
- Line 20, "materials." should read --material.--.

Signed and Sealed this

Twenty-first Day of April, 1992

Attest:

HARRY F. MANBECK, JR.

*Attesting Officer*     *Commissioner of Patents and Trademarks*